United States Patent
Jamison et al.

(10) Patent No.: US 11,473,426 B2
(45) Date of Patent: Oct. 18, 2022

(54) METHODS TO CHARACTERIZE WELLBORE FLUID COMPOSITION AND PROVIDE OPTIMAL ADDITIVE DOSING USING MEMS TECHNOLOGY

(71) Applicant: Halliburton Energy Services, Inc., Houston, TX (US)

(72) Inventors: Dale E. Jamison, Houston, TX (US); William Walter Shumway, Houston, TX (US); Preston Andrew May, Houston, TX (US); Jay Paul Deville, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 5 days.

(21) Appl. No.: 17/571,010

(22) Filed: Jan. 7, 2022

(65) Prior Publication Data

US 2022/0127961 A1    Apr. 28, 2022

Related U.S. Application Data

(62) Division of application No. 16/879,167, filed on May 20, 2020.

(51) Int. Cl.
*E21B 49/08* (2006.01)
*B81B 3/00* (2006.01)
(Continued)

(52) U.S. Cl.
CPC ........ *E21B 49/0875* (2020.05); *B81B 3/0045* (2013.01); *B81B 7/04* (2013.01);
(Continued)

(58) Field of Classification Search
CPC .. E21B 49/005; E21B 49/0875; E21B 47/005; B81B 7/04; B81B 3/0045
See application file for complete search history.

(56) References Cited

U.S. PATENT DOCUMENTS

| | | |
|---|---|---|
| 4,491,524 A | 1/1985 | Gutierrez et al. |
| 4,635,735 A | 1/1987 | Crownover |

(Continued)

FOREIGN PATENT DOCUMENTS

| | | |
|---|---|---|
| TW | 273222 B | 2/2007 |
| WO | 2021236109 A1 | 11/2021 |

(Continued)

OTHER PUBLICATIONS

Foreign Communication from Related Application—International Search Report and Written Opinion of the Internationa Searching Authority, International Application No. PCT/US2020/034694, dated Oct. 20, 2020, 11 pages.

(Continued)

*Primary Examiner* — John Fitzgerald
(74) *Attorney, Agent, or Firm* — Conley Rose, P.C.; Rodney B. Carroll

(57) ABSTRACT

A method comprising determining a concentration of one or more components of a wellbore servicing fluid during a wellbore servicing operation; and adjusting or maintaining a composition of the wellbore servicing fluid being introduced into a wellbore and/or an operational parameter of the wellbore servicing operation based on the determining of the concentration of the one or more components, wherein the determining of the concentration of the one or more components comprises contacting a sample of the wellbore servicing fluid with a microelectromechanical system (MEMS) device to provide a sample response indicative of the concentration of the one or more components.

20 Claims, 5 Drawing Sheets

(51) Int. Cl.
*B81B 7/04* (2006.01)
*E21B 49/00* (2006.01)
*E21B 47/005* (2012.01)

(52) U.S. Cl.
CPC .......... *E21B 47/005* (2020.05); *E21B 49/005* (2013.01); *B81B 2203/00* (2013.01)

(56) References Cited

U.S. PATENT DOCUMENTS

| | | |
|---|---|---|
| 5,045,219 A | 9/1991 | Trahan et al. |
| 5,719,324 A | 2/1998 | Thundat et al. |
| 5,780,727 A | 7/1998 | Gimzewski et al. |
| 5,822,473 A | 10/1998 | Magel et al. |
| 5,925,822 A | 7/1999 | Naughton |
| 6,176,323 B1 | 1/2001 | Weirich et al. |
| 6,402,302 B1 | 6/2002 | Ozaki et al. |
| 6,457,360 B1 | 10/2002 | Baraktchiev et al. |
| 6,664,540 B2 | 12/2003 | Shimizu et al. |
| 6,925,392 B2 | 8/2005 | McNeil, III et al. |
| 7,003,439 B2 | 2/2006 | Aldred et al. |
| 7,044,239 B2 | 5/2006 | Pinckard et al. |
| 7,392,697 B2 | 7/2008 | Chikenji et al. |
| 7,434,457 B2 | 10/2008 | Goodwin et al. |
| 7,458,257 B2 | 12/2008 | Pop et al. |
| 7,595,876 B2 | 9/2009 | DiFoggio |
| 7,687,108 B2 | 3/2010 | Xu et al. |
| 7,712,527 B2 | 5/2010 | Roddy |
| 7,748,266 B2 | 7/2010 | Evrard et al. |
| 7,814,782 B2 | 10/2010 | DiFoggio |
| 8,065,907 B2 | 11/2011 | Colquhoun |
| 8,297,353 B2 | 10/2012 | Roddy et al. |
| 8,302,686 B2 | 11/2012 | Roddy et al. |
| 8,316,936 B2 | 11/2012 | Roddy et al. |
| 8,513,042 B2 | 8/2013 | Perruchot et al. |
| 8,527,249 B2 | 9/2013 | Jamison et al. |
| 8,528,396 B2 | 9/2013 | Wu et al. |
| 8,542,353 B2 | 9/2013 | Christian et al. |
| 8,542,365 B2 | 9/2013 | Pruessner et al. |
| 8,575,541 B1 | 11/2013 | Jamison et al. |
| 8,684,109 B2 | 4/2014 | Orbell et al. |
| 8,848,197 B2 | 9/2014 | Pruessner et al. |
| 8,904,859 B2 | 12/2014 | Lawrence et al. |
| 9,000,358 B2 | 4/2015 | Jamison et al. |
| 9,103,195 B2 | 8/2015 | Gawski et al. |
| 9,335,271 B2 | 5/2016 | Pruessner et al. |
| 9,335,438 B2 | 5/2016 | Jamison et al. |
| 9,359,882 B2 | 6/2016 | Snyder |
| 9,518,434 B1 | 12/2016 | Champness et al. |
| 9,547,968 B2 | 1/2017 | Adams et al. |
| 9,567,852 B2 | 2/2017 | Jamison et al. |
| 9,922,517 B2 | 3/2018 | Adams et al. |
| 10,358,914 B2 | 7/2019 | Roberson et al. |
| 10,442,986 B2 | 10/2019 | He et al. |
| 10,453,321 B2 | 10/2019 | Adams et al. |
| 11,060,400 B1 | 7/2021 | Jamison et al. |
| 11,255,191 B2 * | 2/2022 | Jamison ................ B81B 7/04 |
| 2002/0103630 A1 | 8/2002 | Aldred et al. |
| 2002/0194906 A1 | 12/2002 | Goodwin et al. |
| 2004/0045350 A1 | 3/2004 | Jones et al. |
| 2004/0097002 A1 | 5/2004 | Pogge et al. |
| 2004/0201012 A1 | 10/2004 | Faris |
| 2005/0087336 A1 | 4/2005 | Surjaatmadja et al. |
| 2005/0241382 A1 | 11/2005 | Coenen |
| 2007/0033990 A1 | 2/2007 | Grey et al. |
| 2008/0283294 A1 | 11/2008 | Colquhoun |
| 2009/0120168 A1 | 5/2009 | Harrison et al. |
| 2009/0250264 A1 | 10/2009 | Dupriest |
| 2009/0320992 A1 | 12/2009 | Xu et al. |
| 2010/0025784 A1 | 2/2010 | Desai et al. |
| 2010/0133008 A1 | 6/2010 | Gawski et al. |
| 2010/0192684 A1 | 8/2010 | Wu et al. |
| 2010/0238454 A1 | 9/2010 | Pruessner et al. |
| 2011/0052116 A1 | 3/2011 | Boersma |
| 2011/0107852 A1 | 5/2011 | Edwards |
| 2011/0192592 A1 | 8/2011 | Roddy et al. |
| 2011/0192594 A1 | 8/2011 | Roddy et al. |
| 2011/0192597 A1 | 8/2011 | Roddy et al. |
| 2011/0203845 A1 | 8/2011 | Jamison et al. |
| 2012/0013335 A1 | 1/2012 | Saasen et al. |
| 2012/0024602 A1 | 2/2012 | Larson |
| 2012/0056308 A1 | 3/2012 | Perruchot et al. |
| 2012/0092175 A1 | 4/2012 | Adams et al. |
| 2012/0145456 A1 | 6/2012 | Rowden |
| 2012/0304758 A1 | 12/2012 | Kumar |
| 2013/0089465 A1 | 4/2013 | Lazzarino et al. |
| 2013/0119489 A1 | 5/2013 | Chang et al. |
| 2013/0153296 A1 | 6/2013 | Aphale et al. |
| 2013/0174642 A1 | 7/2013 | Bourlon et al. |
| 2013/0192360 A1 | 8/2013 | Jamison et al. |
| 2013/0213647 A1 | 8/2013 | Roddy et al. |
| 2013/0330232 A1 | 12/2013 | Pruessner et al. |
| 2013/0332089 A1 | 12/2013 | Kulkarni et al. |
| 2014/0166361 A1 | 6/2014 | Jamison et al. |
| 2014/0172177 A1 | 6/2014 | Jamison et al. |
| 2014/0202689 A1 | 6/2014 | Walton et al. |
| 2014/0238114 A1 | 8/2014 | Klasner |
| 2014/0262510 A1 | 9/2014 | Beddoes et al. |
| 2014/0291240 A1 | 10/2014 | Scheide |
| 2014/0367092 A1 | 12/2014 | Roberson et al. |
| 2015/0066371 A1 | 3/2015 | Brannigan et al. |
| 2015/0211350 A1 | 7/2015 | Norman et al. |
| 2015/0268374 A1 | 9/2015 | Rapoport |
| 2016/0040524 A1 | 2/2016 | Ravi et al. |
| 2016/0108687 A1 | 4/2016 | Rapoport |
| 2016/0252454 A1 | 9/2016 | Zuo et al. |
| 2016/0290131 A1 | 10/2016 | Mitchell et al. |
| 2016/0312551 A1 | 10/2016 | Rowe et al. |
| 2016/0315090 A1 | 10/2016 | Fox et al. |
| 2016/0362972 A1 | 12/2016 | Dykstra et al. |
| 2017/0069187 A1 | 3/2017 | Adams et al. |
| 2017/0159370 A1 | 6/2017 | Evans et al. |
| 2017/0167255 A1 | 6/2017 | Zhang et al. |
| 2017/0299584 A1 | 10/2017 | Adams |
| 2017/0343969 A1 | 11/2017 | Dykstra et al. |
| 2017/0356282 A1 | 12/2017 | Close et al. |
| 2018/0010446 A1 | 1/2018 | Roberson |
| 2018/0010449 A1 | 1/2018 | Roberson et al. |
| 2018/0023355 A1 | 1/2018 | Feodorescu et al. |
| 2018/0030824 A1 | 2/2018 | Roberson et al. |
| 2018/0082090 A1 | 3/2018 | Roberson et al. |
| 2018/0174418 A1 | 6/2018 | Adams et al. |
| 2019/0016939 A1 | 1/2019 | Fripuraneni et al. |
| 2019/0178059 A1 | 6/2019 | Zheng et al. |
| 2019/0226336 A1 | 7/2019 | Benson et al. |
| 2019/0227048 A1 | 7/2019 | Ye et al. |
| 2019/0309613 A1 | 10/2019 | Jamison et al. |
| 2019/0376386 A1 | 12/2019 | Wright et al. |
| 2020/0003046 A1 | 2/2020 | Zheng et al. |
| 2020/0166478 A1 | 5/2020 | Mohr et al. |
| 2020/0362694 A1 | 11/2020 | Al-Rubaii et al. |
| 2020/0362695 A1 | 11/2020 | Al-Rubaii et al. |
| 2020/0371084 A1 | 11/2020 | Havenga et al. |
| 2021/0148215 A1 | 5/2021 | Jamison et al. |
| 2021/0363872 A1 | 11/2021 | Jamison et al. |
| 2021/0363884 A1 | 11/2021 | Jamison et al. |

FOREIGN PATENT DOCUMENTS

| | | |
|---|---|---|
| WO | 2021236110 A1 | 11/2021 |
| WO | 2021236111 A1 | 11/2021 |

OTHER PUBLICATIONS

Foreign Communication from Related Application—International Search Report and Written Opinion of the Internationa Searching Authority, International Application No. PCT/US2020/034693, dated Feb. 10, 2021, 10 pages.

Foreign Communication from Related Application—International Search Report and Written Opinion of the Internationa Searching Authority, International Application No. PCT/US2020/034692, dated Feb. 2, 2021, 13 pages.

(56) References Cited

OTHER PUBLICATIONS

Norouzi, Maziar et al., "Design of Piezoelectric Microcantilever Chemical Sensors In COMSOL Multiphysics Area," Islamic Azad University, 2009, pp. 184-188.

Redburn, H. et al., "Field Lubricuty Measurements Corrilate with Improved Performance of Novel Water-Based Drilling Fluid," 11th Offshore Mediterranean Conference and Exhibition, Mar. 2013, 13 pages, OMC.

Vos, Bart E. et al., "The Benefits of Monitoring Torque & Drag in Real Time," IADC/SPE Pacific Drilling Technology Conference, Sep. 2000, 8 pages, IADC/SPE Asia Pacific Drilling Technology.

Battiston, F.M. et al., "A chemical sensor based on a microfabricated cantilever array with simultaneous resonance-frequency and bending readout", Sensors and Actuators, 2001, pp. 122-131, vol. B, No. 77, Elsevier Science, B.V.

Joshi, Priyanka et al., "Distributed MEMS Mass-Sensor Based on Piezoelectric Resonant Micro-Cantilevers," Journal of Microelectromechanical System, Jun. 2019, pp. 382-389, vol. 28, No. 3, IEEE.

Zhao, Libo et al., "A MEMS Resonant Sensor to Measure Fluid Density and Viscosity under Flexural and Torsional Vibrating Modes," Sensors, 2016, vol. 16, MDPI, 15 pages.

\* cited by examiner

METHODS TO CHARACTERIZE WELLBORE FLUID COMPOSITION AND PROVIDE OPTIMAL ADDITIVE DOSING USING MEMS TECHNOLOGY

CROSS-REFERENCE TO RELATED APPLICATIONS

This application is a divisional of and claims priority to U.S. patent application Ser. No. 16/879,167 filed May 20, 2020 now U.S. Pat. No. 11,255,191 B2, entitled "Methods to Characterize Wellbore Fluid Composition and Provide Optimal Additive Dosing Using MEMS Technology," which is incorporated by reference herein in its entirety.

STATEMENT REGARDING FEDERALLY SPONSORED RESEARCH OR DEVELOPMENT

Not applicable.

TECHNICAL FIELD

The present disclosure relates generally to methods of servicing a wellbore. More specifically, it relates to wellbore servicing methods including determining a concentration of one or more components of a wellbore servicing fluid during a wellbore servicing operation via a microelectromechanical ("MEMS") device.

BACKGROUND

Natural resources such as gas, oil, and water residing in a subterranean formation or zone are usually recovered by drilling a wellbore down to the subterranean formation while circulating a drilling fluid in the wellbore. During drilling or other wellbore servicing operations, the composition of a drilling fluid, also commonly known as "mud", or another wellbore servicing fluid can change from an expected composition thereof, and such a change can be indicative of a variety of downhole events. Accordingly, it is desirable to provide systems and methods for determining a concentration of one or more components of a drilling fluid or of another wellbore servicing fluid, such that a composition of the drilling fluid or the other wellbore servicing fluid being introduced into the wellbore and/or an operational parameter of the wellbore servicing operation can be adjusted or maintained based on the determining of the concentration of the one or more components.

BRIEF SUMMARY OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

A descriptor numeral can be utilized generically herein to refer to any embodiment of that component. For example, as detailed hereinbelow with reference to FIG. 5, generic reference to a "MEMS device 40" can indicate any MEMS device 40, such as a MEMS device 40A configured for analyzing a sample 224A of WSF 224 uphole from a mud pit inlet line 225, a MEMS device 40B configured for analyzing a sample 224A of WSF 224 uphole from a mud pit outlet line 227, a MEMS device 40C configured for analyzing a sample 224A of WSF 224 uphole from a feed pipe 226, and/or a MEMS device 40D configured for analyzing a sample 224A of WSF 224 downhole from an interior conduit 252 and/or from an annulus 228 via a bottom hole assembly (BHA) 248.

Disclosed herein is a wellbore servicing method including: determining a concentration of one or more components of a wellbore servicing fluid (WSF) during a wellbore servicing operation; and adjusting or maintaining a composition of the wellbore servicing fluid being introduced into a wellbore and/or an operational (or "operating") parameter of the wellbore servicing operation based on the determining of the concentration of the one or more components, wherein the determining of the concentration of the one or more components includes contacting a sample of the wellbore servicing fluid with a microelectromechanical system (MEMS) device to provide a sample response indicative of the concentration of the one or more components. In aspects, the wellbore servicing method of this disclosure enables the composition of a wellbore servicing fluid (e.g., a drilling fluid, a completion fluid, etc.) to be determined in real time, whereby adjustments to the wellbore servicing operation (e.g., the drilling operation, the completions operation, etc.) can be taken to control and/or optimize performance of the wellbore servicing operation (e.g., the drilling operation, the completions operation, etc.). In aspects, the method enables at least partial automation of the adjusting or maintaining of the composition of the wellbore servicing fluid being introduced into the wellbore and/or of the adjusting or maintaining of the operational parameter of the wellbore servicing operation based on the determining of the concentration of the one or more components. The MEMS device can provide analytical quality data regarding the chemical content/composition of the wellbore servicing fluid.

Figure 1:
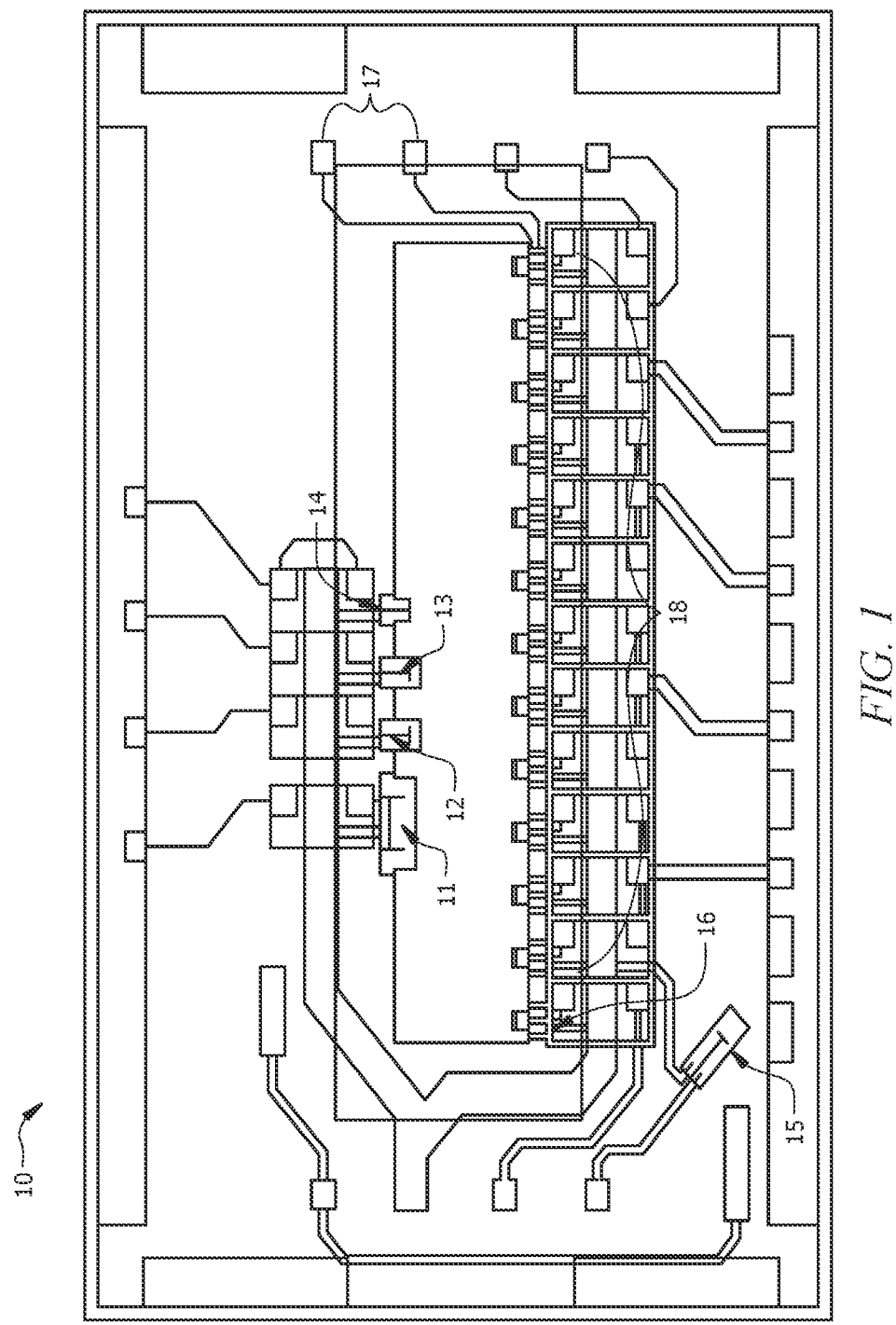
FIG. 1 is a schematic of a sensor or "molecular property spectrometer (MPS)" chip suitable for use in the method of this disclosure.
Figure 2:
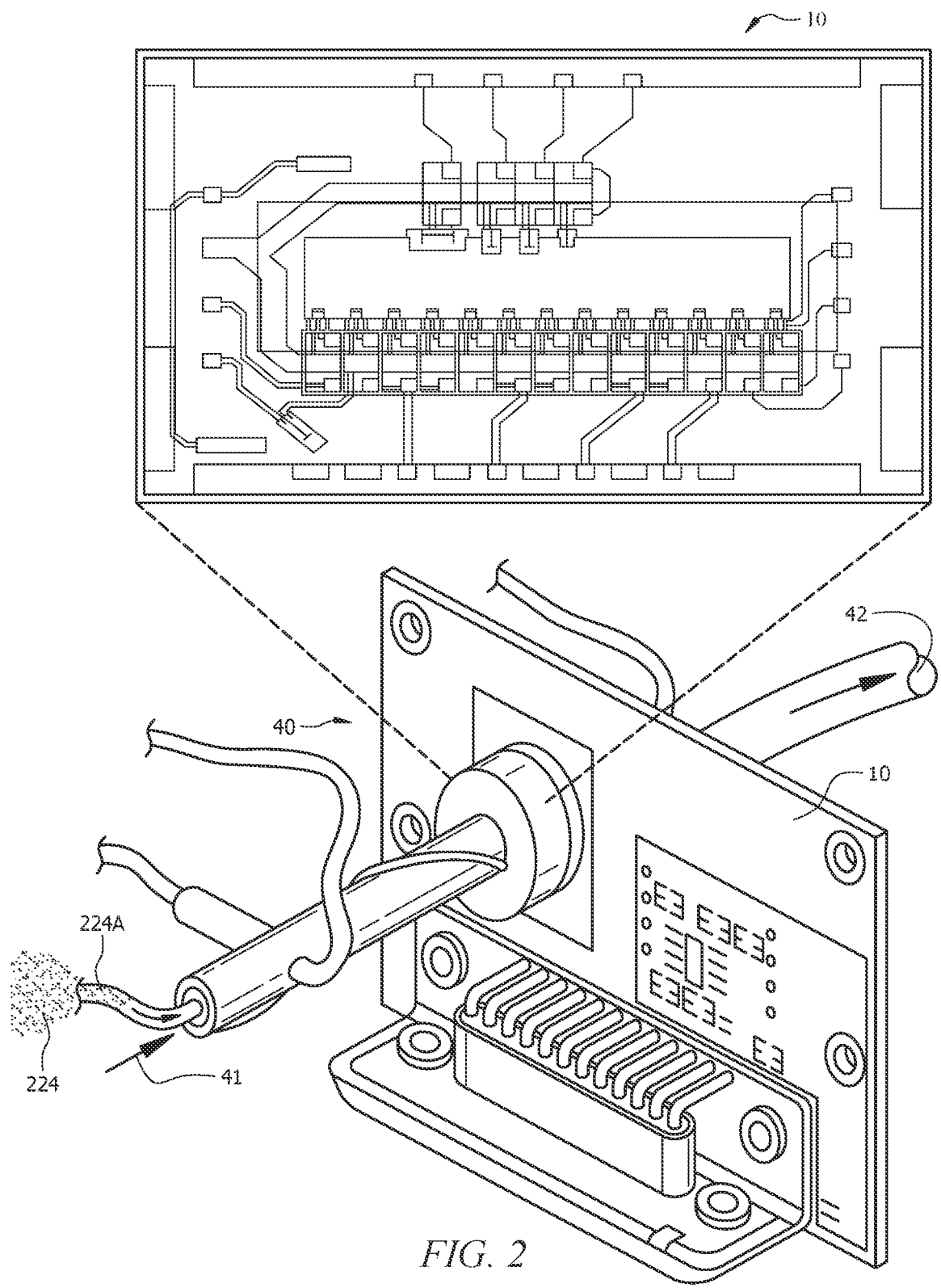
FIG. 2 is a schematic of a MEMS device including a chip of FIG. 1.

The MEMS device can include a sensor having microcantilever-based self-sensing array (SSA) technology. Such a sensor may also be referred to herein as a "molecular property spectrometer chip", an "MPS chip", an "MEMS chip", or simply a "chip". FIG. 1 is a schematic of a sensor or MPS chip 10 suitable for use in the method of this disclosure. Sensor or MPS chip 10 of FIG. 1 includes a surface stress sensor 11, a calorimeter 12 (e.g., a polymer coated calorimeter 12), a thermometer calorimeter 13, an anemometer 14, a thermistor 15, a thermobalance 16, an impedance sensor 17, and polymer coated thermobalances 18. One or a plurality of MPS chips 10 can be incorporated into the MEMS device 40. As depicted in FIG. 2, which is a schematic of a MEMS device 40 including an MPS chip 10, a sample intake line 41 can be utilized to introduce a sample 224A of the wellbore servicing fluid (e.g., wellbore servicing fluid 224, described with reference to FIG. 5 hereinbelow) to MEMS device 40, whereby the sample 224A of the wellbore servicing fluid 224 can be contacted with the MPS chip 10. A sample outlet line 42 can be utilized to remove the sample 224A of the wellbore servicing fluid 224 from the MEMS device 40.

The MEMS device 40 can include a plurality of MPS chips or sensors 10 within a housing. In aspects, the housing includes a wellbore monitoring tool, such as, without limitation, a BARALOGIX® unit, available from Halliburton Energy Services, Houston, Tex. A plurality of chips 10 can be utilized to provide redundancy and/or enable a desired frequency of measurement of the concentration of the one or more components of the WSF 224. Utilizing a redundancy of chips 10 can allow for one or more chips 10 being cleaned or purged, while another one or more chips 10 can be online. Cleaning/purging of the chips 10 will depend on the nature of the interaction of the one or more components (e.g., the analyte) with the chip 10 (e.g., with coating 46 described hereinbelow with reference to FIG. 3). In aspects, flushing with fresh WSF 224, heating (e.g., via piezoresistive heater(s) 48 described hereinbelow with reference to FIG. 3) to flash the analyte off the chip 10, or the like can be utilized to clean spent chips 10 prior to reuse.

Figure 3:
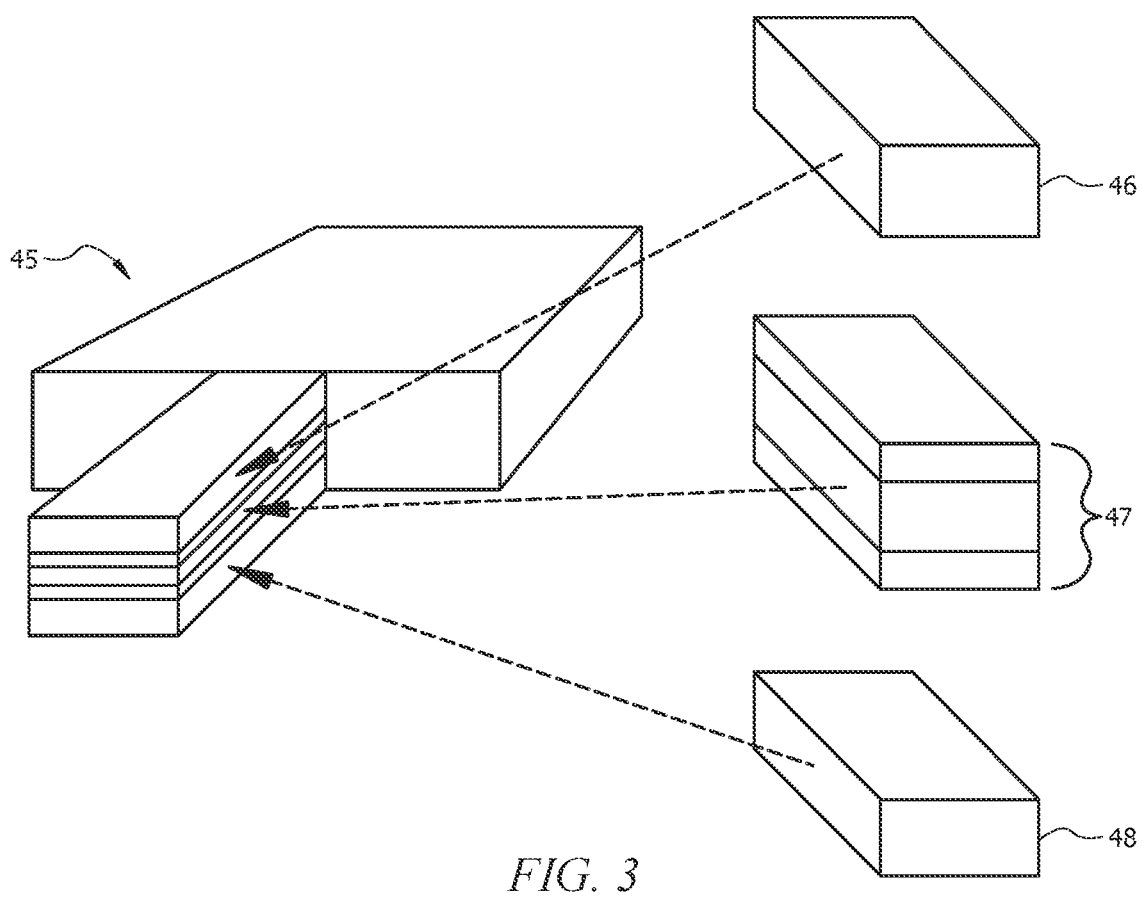
FIG. 3 is a schematic of a cantilever element of a chip of FIG. 1.
Figure 4A:
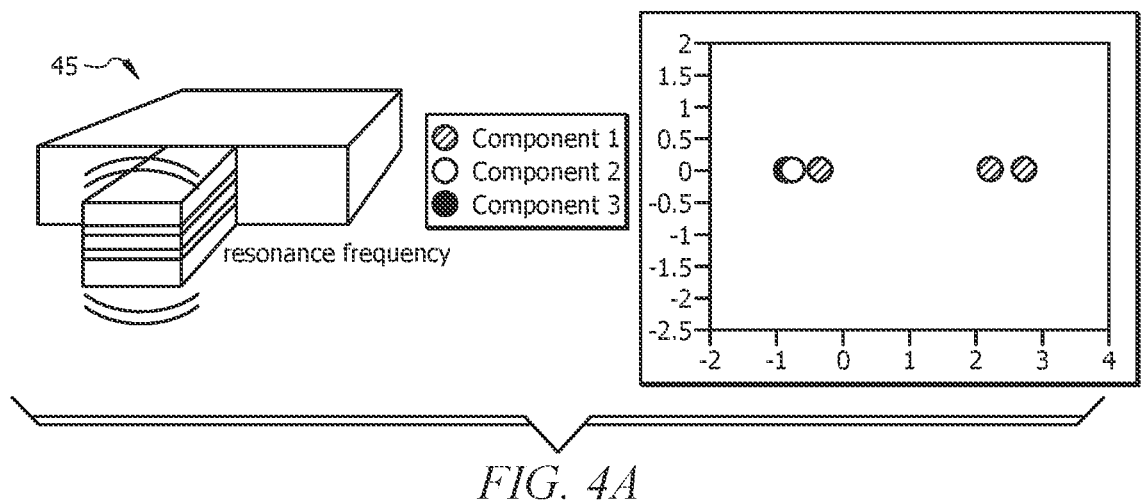
FIG. 4A, FIG. 4B, and FIG. 4C are pictorial representations depicting how resonance frequency (FIG. 4A), resonance frequency and heat (FIG. 4B), and resonance frequency and heat and impedance (FIG. 4C) can be utilized to distinguish one or more components of a wellbore servicing fluid.
Figure 4B:
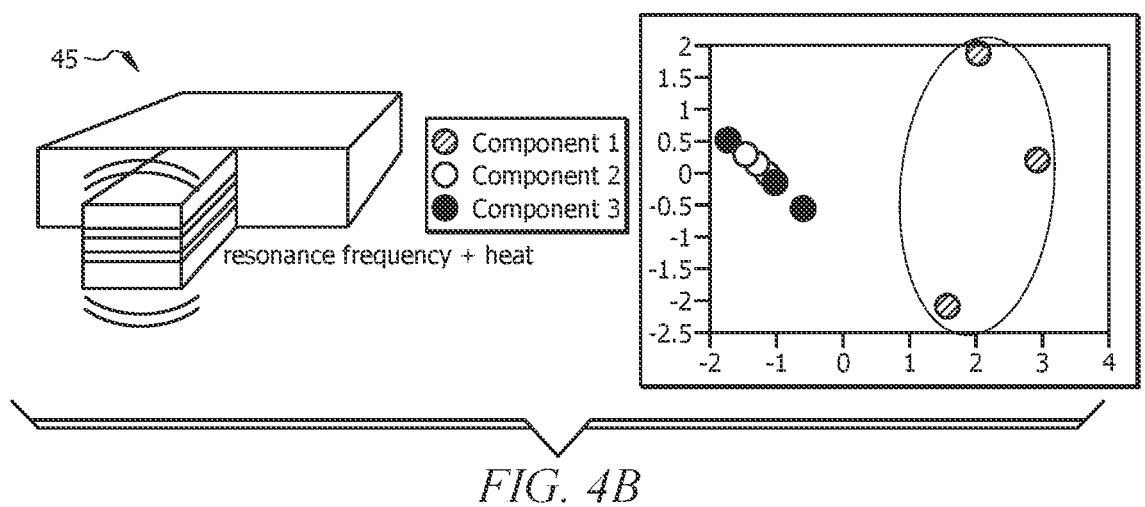
Figure 4C:
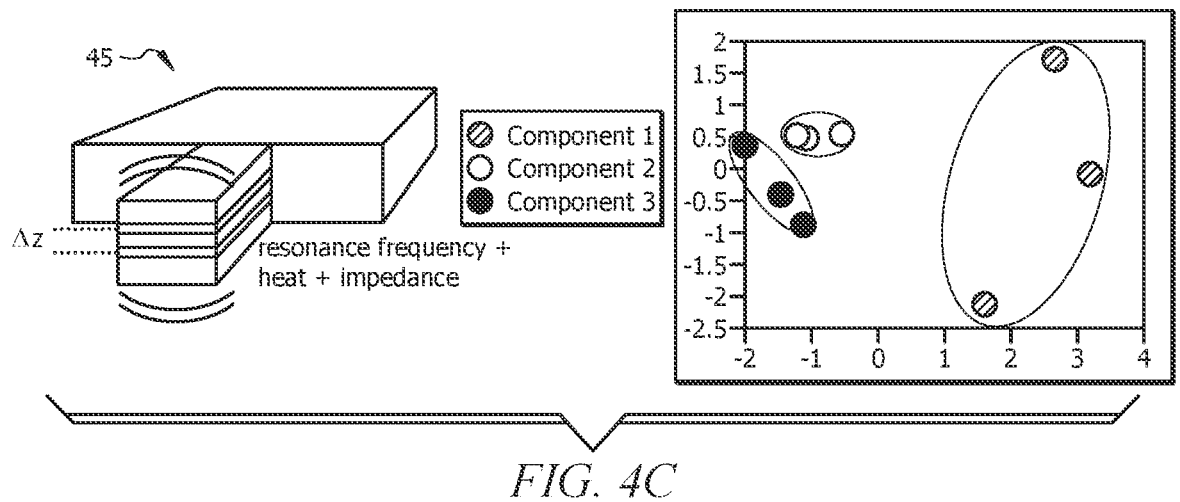

The MEMS device 40 can include an array of cantilever elements (e.g., microcantilevers) with integrated piezoelectric sensing elements that provide electrical actuation and sensing of resonance frequency. For example, FIG. 3 is a schematic of a cantilever element 45. Cantilever element 45 includes coating 46, metal/piezoelectric sandwich 47, and silicon with piezoresistive heater 48. Coating 46 (e.g., a polymer coating 46) can be operable for analyte absorption. Metal/piezoelectric sandwich 47 can provide drive/sense for frequency detection, impedance sensor, and temperature sensor. Piezoresistive heater 48 can provide for heat control (e.g., heat pulses). Resonance frequency, heat, and/or impedance can be utilized to determine the concentration of the one or more components of the wellbore servicing fluid 224. For example, FIG. 4A, FIG. 4B, and FIG. 4C are pictorial representations depicting the characteristic resonance that various configurations of cantilever element 45 can provide (resonance frequency (FIG. 4A), resonance frequency and heat (FIG. 4B), and resonance frequency and heat and impedance (FIG. 4C)). The resonances can be utilized to distinguish one or more components of the wellbore servicing fluid 224.

The array of microcantilevers 45 can include, for each of the one or more components, one or more microcantilevers 45 including a coating 46 sensitive to an analyte specific to the each of the one or more components (e.g., specific to the component itself or otherwise indicative of the component). As depicted in FIG. 3, the coating 46 of at least a portion of the array of microcantilevers 45 can includes a polymer. The MEMS device 40 can include a plurality of complementary chemical cantilevers 45 on each of the one or the plurality of MPS chips or sensors 10.

In embodiments, the MEMS device 40 includes a Molecular Property Spectrometer™ (MPS) chip 10, such as available from Nevada Nanotech Systems of Reno, Nev. Such an MPS chip 10 can, in aspects, rapidly (e.g., within a second) create a large, rich dataset of chemical information. Software can be utilized to identify the types of molecules (e.g., one or more components) present in the sample 224A of the wellbore servicing fluid 224.

Because the MEMS device 40 is a microelectromechanical system or MEMS device 40, it can have low power consumption, be minute in size (e.g., micrometer or nanometer scale), have a light weight, and be robust for wellbore servicing applications. In aspects, in a span of milliseconds, the sensors 10 can heat to hundreds of degrees Celsius, make a variety of high-precision thermal measurements, and cool down (e.g., to ambient temperature). In aspects, various components of the MEMS device 40 can operate to detect picogram-scale masses and/or measure temperature with 0.01-degree resolution. In aspects, the MEMS device 40 can operate at temperatures in a range of from about −40° C. to 75° C. and non-condensing humidity levels.

An MPS chip 10 can incorporate an array of microcantilevers 45 with integrated piezoelectric sensing elements 47 that provide electrical actuation and sensing of resonance frequency. Monitoring resonance is a highly sensitive way to measure very small masses of adsorbed analyte. An array of microcantilevers or sensors 45 can be electrically monitored in a low-cost, robust fashion via the MPS chip 10 due to the piezoelectric configuration provided by the MPS chip 10.

One or more of the microcantilevers 45 can include a built-in resistive heater 48 whereby an assortment of thermal analyses (e.g. Differential Scanning calorimetry or DSC) can be conducted. The resistive heater(s) 48 can allow for the cleaning of each microcantilever 45/MPS chip 10 after processing a sample 224A of the wellbore servicing fluid 224. The resistors 48 can also enable temperature and flow compensation in order to minimize noise and drift of the piezoelectric sensors 47 and further enhance sensitivity.

The selected polymer coatings 46 can have unique chemical and surface interactions with the test sample 224A of the wellbore servicing fluid 224. These unique chemical and surface interactions can be manifested in the resonant frequency of the each cantilever element 45 in the MPS chip 10. By using many different coatings 46, the resonance frequency response of each cantilever element 46 can be designed to provide a unique signature for the chemical properties of the sample 224A. Any suitable coating 46 that interacts with an analyte (e.g., each of the one or more components of the wellbore servicing fluid 224) to change the resonance frequency can be utilized. The type of interactions can include sorption (e.g., the analyte (e.g., the component of the WSF 224) adsorbs or absorbs on the coating 46), dissolution/solvation (the analyte dissolves or solvates the coating 46), precipitation (the analyte precipitates on the coating 46) and/or other interactions. The chemistry and concentration of the sample 224A of the WSF 224 may be determined using this technology. Additionally, the MEMS device 40 can provide a heat source (e.g., piezoelectric heater 48) that allows the signature to be thermally responsive. In some cases, impedance can be included (e.g., via metal/piezoelectric sandwich 47) in the MEMS device 40 to better differentiate chemical species and concentration.

To facilitate a better understanding of the present invention, the following examples of certain embodiments are given. In no way should the following examples be read to limit, or define, the scope of the invention. One or more embodiments of the present disclosure may be applicable to any type of drilling operation including, but not limited to, exploration, services or production operation for any type of well site or reservoir environment including subsurface and sub sea environments.

Although the following disclosure concentrates on wellbore servicing fluids used in drilling operations (for instance, drilling fluids or "muds"), the methods and tools can be extended for use in other contexts as well. For example, wellbore servicing fluids can be used in a variety of subterranean operations, including stimulation treatments, conformance treatments, lost circulation treatments, hydraulic fracturing treatments, acidizing treatments, remediation treatments, scale removal treatments, scale inhibition treatments, and the like. Use of these terms herein does not imply any particular action by the fluid or any particular component thereof.

As used herein, the term "flow path" refers to a route through which any fluid is capable of being transported between at least two points. In one or more embodiments, the flow path need not be continuous or otherwise contiguous between the two points. Exemplary flow paths include, but are not limited to, a flow line, a pipeline, production tubing, drill string, work string, casing, a wellbore, an annulus defined between a wellbore and any tubular arranged within the wellbore, a mud pit, a subterranean formation, any other suitable flow path, combinations thereof, or the like. The term "flow path" does not necessarily imply that a fluid is flowing therein; rather, a fluid is capable of being transported or otherwise flowable therethrough.

According to one or more aspects of the present disclosure, an information handling system or computer equipment may be employed. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Description of the wellbore servicing system of this disclosure will now be made with reference to FIG. 5, which is a schematic diagram of a wellbore servicing system 200, according to one or more aspects of this disclosure. In aspects, the wellbore servicing fluid 224 includes a fracturing fluid, a cementitious fluid, a remedial fluid, a perforating fluid, a sealant, a drilling fluid, a drill-in fluid, a spacer fluid, a completion fluid, a gravel pack fluid, a diverter fluid, a gelation fluid, a polymeric fluid, an aqueous fluid, an oleaginous fluid, or a combination thereof. The wellbore servicing fluid 224 can be introduced into a wellbore 218 at a volumetric flow rate of greater than or equal to about 3, 10, 20, 30, or 40 barrels per minute (BPM), or in a range of from about 3 to about 40, from about 3 to about 20, from about 10 to about 20, or from about 5 to about 20 BPM.

The one or more components of the wellbore servicing fluid 224 for which the concentration is determined during the wellbore servicing operation can include any component of the wellbore servicing fluid 224 for which knowledge of the concentration in the wellbore servicing fluid 224 is desired and for which component or "analyte" a MEMS device is operable to detect (i.e., the MEMS device 40 includes one or more microcantilever elements 45 having a coating 46 sensitive to the component). For example, and without limitation, the one or more components can include a chemical additive, water, a gas, a hydrocarbon, a salt, or a combination thereof. In aspects, the one or more components include a shale inhibitor, a lubricant, an emulsifier, a viscosifier, a thinner, a polymer, a gas, an oil, a hydrocarbon, water, a biocide, a salt, a corrosion inhibitor, a bridging agent, a fluid loss control agent, pH control agent, an antioxidant, an acid generator, or a combination thereof. A MEMS device 40 can be configured to detect a plurality of components of the wellbore servicing fluid 224, in aspects. A plurality of MEMS devices 40 can be utilized, in embodiments, as described further hereinbelow.

In aspects the determining of the concentration of the one or more components of the wellbore servicing fluid 224 can further include: after contacting the sample 224A with the MEMS device 40 to provide the sample response, providing a treated sample by treating the sample 224A (e.g., or a volume of WSF 224 from which the sample 224A is taken) to selectively alter a response of the MEMS device 40 thereto; contacting the treated sample with the MEMS device 40 to provide a treated sample response; and utilizing a difference between the treated sample response and the sample response with calibration curves to determine the concentration of the one or more components of the wellbore servicing fluid 224. A variety of treatments can be utilized. Without limitation, treating to provide the treated sample can include treating with a chemical additive that selectively alters the response of the MEMS device 40. The chemical additive can include, for example, an acid, a base, an enzyme, an oxidizer, a reducer, and anti-oxidant, an oxygen scavenger, a free radical source, a free radical trap, a chemical reactant, a surfactant, a precipitant, a demulsifier, a flocculant, a deflocculant, or a combination thereof. In aspects, treating the sample can include, treating with UV light, IR light, visible spectrum light, ultrasonic treatment, heat, microwaves, x-rays, laser light, or a combination thereof.

The sample 224A of the wellbore servicing fluid 224 can include a solids-reduced sample 224A of the wellbore servicing fluid 224, wherein the solids-reduced sample 224 of the wellbore servicing fluid 224 includes a reduced amount of solids relative to the wellbore servicing fluid 224 from which the sample 224A is obtained. A solids reduced sample 224A of the WSF 224 can be obtained via a variety of methods, such as, without limitation, filtering or centrifuging the wellbore servicing fluid 224 from which the sample 224A is obtained to provide the solids-reduced sample 224A of the wellbore servicing fluid 224. In aspects, wellbore servicing fluid filtrate (e.g., drilling fluid filtrate) can be collected through standard filtration testing, and the solids-reduced sample of the wellbore servicing fluid 224 can include the wellbore servicing fluid filtrate (e.g., drilling fluid filtrate). This may allow for analysis of the concentration of salt, shale inhibitor, and/or other small molecule additives, such as, without limitation, biocides and corrosion inhibitors in water-based fluids. The presence of water in an oil-based filtrate can also be assayed, in aspects. While potentially fewer additives may be quantified in this manner, compatibility of the sample 224A and the MEMS device 40 may be greater via utilization of a solids-reduced sample 224A.

The method can further include carrying out the determining of the concentration of the one or more components of the WSF 224 at a certain frequency, for example, at least once every sampling time period. For example, the sampling time period can be in a range of from about 0.01 to about 24 hours, from about 1 minute to about 15 hours, or from about 0.5, 1, 2, 3, 4, 5, 6, 7, 8, 9, or 10 minutes to about 0.1, 0.2, 0.3, 0.4, 0.5, 0.6, 0.7, 0.8, 0.9, 1, 2, 3, 4, 5, 6, 7, 8, 9, 10, 15, or 20 hours. Any desired sampling frequency can be utilized via utilization of an appropriate number and arrangement of chips 10 and/or MEMS devices 40.

The concentration of the one or more components of the WSF 224 determined via the MEMS device 40 can be utilized to calculate a parameter of the WSF 224. In such aspects, the adjusting or maintaining of the composition of the wellbore servicing fluid 224 being introduced into the wellbore 218 and/or an operational parameter of the wellbore servicing operation based on the determining of the concentration of the one or more components can include adjusting or maintaining the composition of the wellbore servicing fluid 224 to have a desired value of the parameter. For example, the parameter can include an oil to water ratio (OWR) of the wellbore servicing fluid 224, a density (e.g., solids concentration) of the wellbore servicing fluid 224, an emulsifier content, a water phase salinity (e.g., salt content of the water phase), a shale inhibitor content, viscosifier content, a fluid loss additive content, a lost circulation additive, a thinner content, a surfactant content, a combination thereof, or the like.

As noted above, FIG. 5 illustrates wellbore servicing system 200, including wellbore monitoring system 210, that may employ one or more of the methods described herein in order to characterize a wellbore fluid composition and provide optimal additive dosing and/or another response, according to one or more embodiments. The exemplary wellbore servicing system 200 includes a drilling platform 202 that supports a derrick 204 having a traveling block 206 for raising and lowering a drill string 208. A kelly 212 supports the drill string 208 as it is lowered through a rotary table 214. A drill bit 216 is attached to the distal end of the drill string 208 and is driven either by a downhole motor and/or via rotation of the drill string 208 from the well surface 240. As the drill bit 216 rotates, it creates a wellbore 218 that penetrates various subterranean formation(s) 220. The example wellbore 218 shown in FIG. 5 includes a vertical wellbore. However, a wellbore servicing system 200 may include any combination of horizontal, vertical, slant, curved, or other wellbore orientations.

A pump 222 (for example, a mud pump) circulates wellbore servicing fluid 224 through a feed pipe 226 and to the kelly 212, which conveys the wellbore servicing fluid 224 downhole (in the direction indicated by arrow A1) through an interior conduit 252 defined in the drill string 208 and through one or more orifices 223 in the drill bit 216. The wellbore servicing fluid 224 is then circulated back to the surface 240 via an annulus 228 (in a direction indicated by arrow A2) defined between the drill string 208 and the walls of the wellbore 218. The route through which wellbore servicing fluid 224 circulates may be described using one or more fluid flow paths 219. In one or more embodiments, operation of wellbore servicing system 200 can include diverting wellbore servicing fluid 224 to fluid reclamation equipment 232 and optimizing associated fluid reclamation equipment 232. The WSF returned to the surface 240 can be introduced into one or more mud pits 265, from which it can subsequently be pumped back to interior conduit 252 via pump(s) 222 and feed pipe 226.

The wellbore servicing fluid 224 may carry out several functions, such as, without limitation, lubrication of drill bit 216 and the mechanical removal of cuttings and solids. The wellbore servicing fluid 224 may be any wellbore servicing fluid known to those skilled in the art. In one or more embodiments, for example, the wellbore servicing fluid 224 may be or include water, such as a brine or the like, known to those skilled in the art. The wellbore servicing fluid 224 may be or include, but is not limited to, municipal treated or fresh water, sea water, salt water (for example, water containing one or more salts dissolved therein) naturally-occurring brine, a chloride-based, bromide-based, or formate-based brine containing monovalent and/or polyvalent cations, aqueous solutions, non-aqueous solutions, base oils, and any combination thereof. Examples of chloride-based brines include sodium chloride and calcium chloride. Examples of bromide-based brines include sodium bromide, calcium bromide, and zinc bromide. Examples of formate-based brines include sodium formate, potassium formate, and cesium formate.

In aspects, the wellbore servicing fluid 224 can have monovalent and/or polyvalent cations, alkali and alkaline earth metals, or combinations thereof. Additional examples of suitable salts include LiCl, NaCl, KCl, NaBr, $CaCl_2$, $CaBr_2$, $MgCl_2$, $ZnCl_2MgBr_2$, $ZnBr_2$, acetate salts, sodium acetate, potassium acetate, ammonium chloride ($NH_4Cl$), calcium nitrate, potassium phosphate, sodium formate, potassium formate, rubidium formate, cesium formate, or combinations thereof. In an aspect, the WSF 224 includes a brine including the salt.

In an aspect, the base fluid of WSF 224 includes an aqueous fluid. Aqueous fluids that may be used in the WSF include any aqueous fluid suitable for use in subterranean applications, provided that the aqueous fluid is compatible with the other components (e.g., shale inhibitor) used in the WSF 224. For example, the aqueous fluid may include water or a brine. In an aspect, the aqueous fluid includes an aqueous brine. In an aspect, the WSF 224 suitable for use in the present disclosure may include any suitable salt(s). In such aspect, the aqueous brine generally includes water and an inorganic monovalent salt, an inorganic multivalent salt, or both. The aqueous brine may be naturally occurring or artificially-created. Water present in the brine may be from any suitable source, examples of which include, but are not limited to, sea water, tap water, freshwater, water that is potable or non-potable, untreated water, partially treated water, treated water, produced water, city water, well-water, surface water, liquids including water-miscible organic compounds, and combinations thereof. The salt or salts in the water may be present in an amount ranging from greater than about 0% by weight to a saturated salt solution, alternatively from about 1 wt. % to about 30 wt. %, or alternatively from about 5 wt. % to about 10 wt. %, based on the weight of the salt solution. In an aspect, the salt or salts in the water may be present within the base fluid in an amount sufficient to yield a saturated brine. As will be appreciated by one of skill in the art, and with the help of this disclosure, the type and concentration of salt solutions utilized as a base fluid is dependent on the WSF 224 density (e.g., drilling fluid density, completion fluid density, etc.), which may range, without limitation, from about 8 lb/gallon to about 20 lb/gallon, alternatively from about 10 lb/gallon to about 18 lb/gallon, or alternatively from about 12 lb/gallon to about 16 lb/gallon.

Nonlimiting examples of aqueous brines suitable for use in the present disclosure include chloride-based, bromide-based, phosphate-based or formate-based brines containing monovalent and/or polyvalent cations, salts of alkali and alkaline earth metals, or combinations thereof. Additional examples of suitable brines include, but are not limited to brines including salts such as LiCl, NaCl, KCl, NaBr, $CaCl_2$, $CaBr_2$, $MgCl_2$, $ZnCl_2$. $MgBr_2$, $ZnBr_2$, acetate salts, sodium acetate, potassium acetate, ammonium chloride ($NH_4Cl$), calcium nitrate, potassium phosphate, sodium formate, potassium formate, rubidium formate, cesium formate, or combinations thereof. In an aspect, the base fluid includes a brine.

In an aspect, the base fluid of the WSF 224 includes an emulsion. In such aspect, the emulsion can be an oil-in-water emulsion including a non-oleaginous (e.g., an aqueous fluid of the type previously described herein) continuous phase and an oleaginous (e.g., an oil-based fluid, such as for example an oleaginous fluid) discontinuous phase. Oleaginous fluids that may be used in the WSF 224 include any oleaginous fluid suitable for use in subterranean applications, provided that the oleaginous fluid is compatible with the other components utilized in the WSF 224. Examples of oleaginous fluids suitable for use in a WSF 224 include, but are not limited to, petroleum oils, natural oils, synthetically-derived oils, oxygenated fluids, or combinations thereof. In an aspect, the oleaginous fluid includes diesel oil, kerosene oil, mineral oil, synthetic oils, aliphatic hydrocarbons, polyolefins (e.g., alpha olefins, linear alpha olefins and/or internal olefins), paraffins, silicone fluids, polydiorganosiloxanes, oxygenated solvents, esters, diesters of carbonic acid, alcohols, alcohol esters, ethers, ethylene glycol, ethylene glycol monoalkyl ether, ethylene glycol dialkyl ether, or combinations thereof, wherein the alkyl groups are methyl, ethyl, propyl, butyl, and the like.

The base fluid may be present within the WSF 224 in any suitable amount. For example, the base fluid may be present within the WSF 224 in an amount of from about 10 wt. % to about 99 wt. %, alternatively from about 20 wt. % to about 95 wt. %, or alternatively from about 40 wt. % to about 90 wt. %, based on the total weight of the WSF 224. Alternatively, the base fluid may include the balance of the WSF 224 after considering the amount of the other components used. As will be appreciated by one of skill in the art, and with the help of this disclosure, the amount of base fluid (e.g., aqueous base fluid) in the WSF 224 depends on the desired density of the WSF 224.

In aspects, the WSF 224 includes solids. For example, WSF 224 can be a drilling fluid, the density of which can be provided using a solid material such as, without limitation, barite, hematite, calcium carbonate, or the like. In aspects, the WSF 224 can have up to about 20, 30, or 35 volume percent (vol %) of such solid components. In such aspects, an oil based WSF 224 can include (or primarily include) oil, brine, and weighting materials (e.g., barite), optionally with other components in smaller quantities. In other aspects, the WSF 224 is a water base WSF 224 absent the base oil.

In one or more embodiments, upon returning to the surface and exiting the wellbore 218, the wellbore servicing fluid 224 may be conveyed to one or more servicing fluid reclamation equipment 232 fluidly coupled to the annulus 228. The reclamation equipment 232 may be configured to receive and rehabilitate the wellbore servicing fluid 224 in preparation for its reintroduction into the wellbore 218, if desired. The reclamation equipment 232 may include one or more filters or separation devices configured to clean the wellbore servicing fluid 224. The reclamation equipment 232 may include, for example, a shale shaker, a centrifuge, a diatomaceous earth filter, or the like.

In one or more embodiments, wellbore servicing system 200 can include one or more instrument trucks 236, one or more pump trucks 238, and a wellbore servicing fluid control subsystem 231. The wellbore servicing system 200 may perform one or more wellbore servicing operations.

The one or more pump trucks 238 may include any one or more of one or more mobile vehicles, one or more immobile installations, one or more skids, one or more hoses, one or more tubes, one or more fluid tanks, one or more fluid reservoirs, one or more pumps, one or more valves, one or more mixers, or any other one or more types of structures and equipment. The one or more pump trucks 238 shown in FIG. 5 can supply wellbore servicing fluid 224 or other materials for the wellbore servicing operation. The one or more pump trucks 238 may convey the wellbore servicing fluid 224 downhole through the interior conduit 252 defined in the drill string 208 and through one or more orifices in the drill bit 216.

The one or more instrument trucks 236 may include mobile vehicles, immobile installations, or other structures. The one or more instrument trucks 236 shown in FIG. 5 include a wellbore servicing fluid control subsystem 231 that controls or monitors the wellbore servicing operation applied by the wellbore servicing system 200. One or more communication links 242 may communicatively couple the one or more instrument trucks 236 to the one or more pump trucks 238, or other equipment at a ground surface 240. In one or more embodiments, the one or more communication links 242 may communicatively couple the one or more instrument trucks 236 to one or more controllers 243 disposed at or about the wellbore, one or more sensors (such as surface sensors 258 and downhole sensors 260, which can include one or more MEMS devices 40), other one or more data collection apparatus in the wellbore servicing system 200, remote systems, other well systems, any equipment installed in the wellbore 218, other devices and equipment, or a combination thereof. In one or more embodiments, the one or more communication links communicatively couple the one or more instrument trucks 236 to the wellbore monitoring system 210, which may run one or more simulations and record simulation data. The wellbore servicing system 200 may include a plurality of uncoupled communication links 242 or a network of coupled communication links 242. The communication links 242 may include direct or indirect, wired or wireless communications systems, or combinations thereof.

The wellbore servicing system 200 may also include one or more surface sensors 258 and one or more downhole sensors 260 to measure a pressure, a rate, a temperature, a wellbore servicing fluid composition, and any other parameters of wellbore servicing operations. According to this disclosure, at least one of the surface sensors 258 or the downhole sensors 260 includes a MEMS device 40, as described hereinabove, operable to determine the concentration of the one or more components of the WSF 224. Surface sensors 258 and downhole sensors 260 may include meters or other equipment that measure properties of one or more fluids in the wellbore 218 at or near the ground surface 240 level or at other locations. The wellbore servicing system 200 may include one or more pump controls 262 or other types of controls for starting, stopping, increasing, decreasing or otherwise controlling pumping as well as controls for selecting or otherwise controlling fluids pumped during the wellbore servicing operation. The wellbore servicing fluid control subsystem 231 may communicate with the one or more of one or more surface sensors 258, one or more downhole sensors 260, the one or more MEMS devices 40, one or more pump controls 262, and other equipment to monitor and control the wellbore servicing operation.

The wellbore monitoring system 210 may include one or more information handling systems located at the wellbore 218 or any one or more other locations. The wellbore monitoring system 210 or any one or more components of the wellbore monitoring system 210 may be located remote from any one or more of the other components shown in FIG. 5. For example, the wellbore monitoring system 210 may be located at a data processing center, a computing facility, or another suitable location. The wellbore servicing system 200 may include additional or different features, and the features of the wellbore servicing system 200 may be arranged as shown in FIG. 5 or in another configuration.

Figure 5:
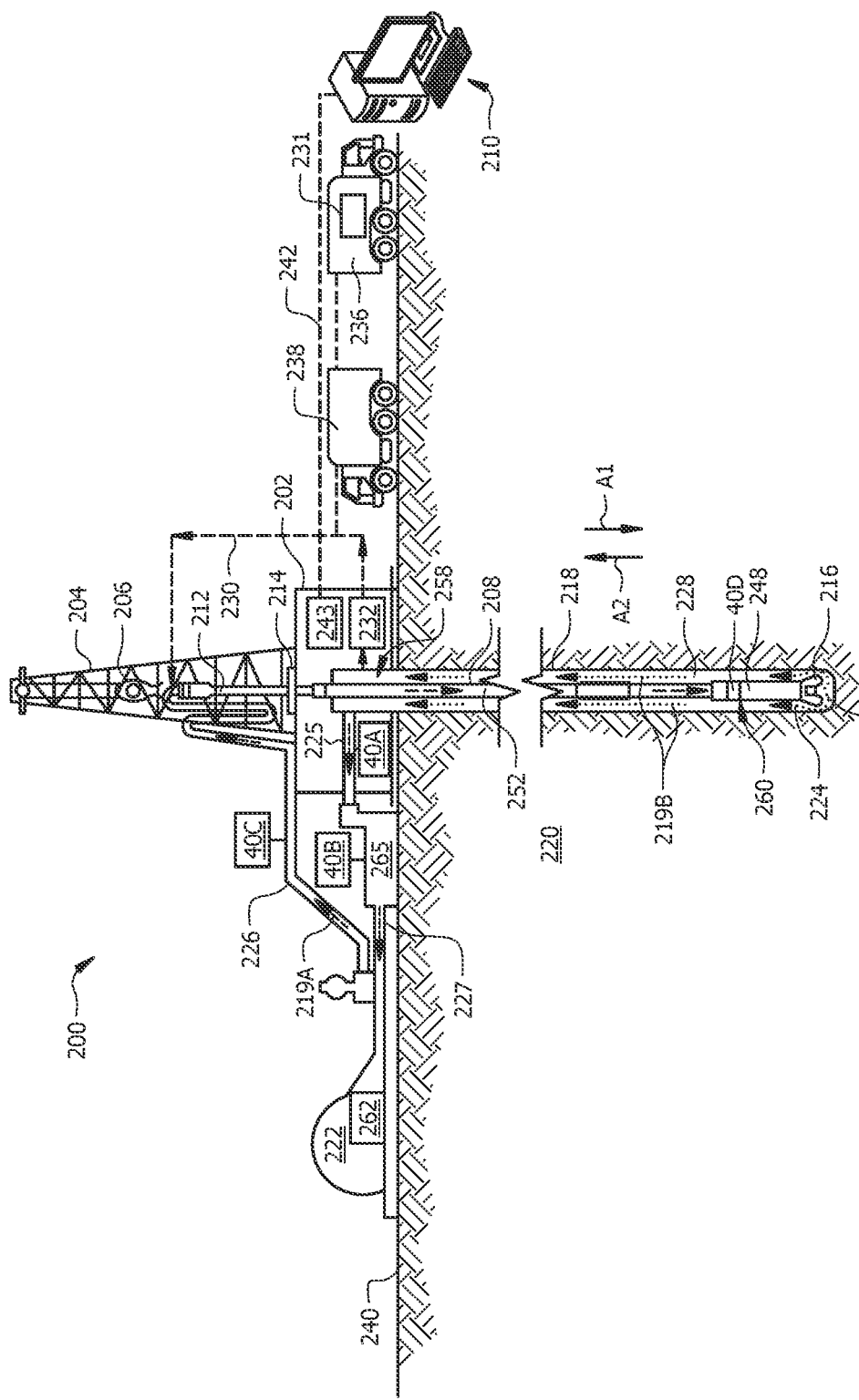
FIG. 5 is a schematic diagram of a wellbore servicing system, according to one or more aspects of this disclosure

In one or more embodiments, the wellbore servicing fluid control subsystem 231 shown in FIG. 5 controls operation of the wellbore servicing system 200. The wellbore servicing fluid control subsystem 231 may include one or more data processing equipment, one or more communication equipment, or other systems that control the circulation and/or composition of the wellbore servicing fluids 224 through the wellbore 218. The wellbore servicing fluid control subsystem 231 may be communicatively linked or communicatively coupled to the wellbore monitoring system 210, which may calculate, select, or optimize wellbore servicing operation parameters. The wellbore servicing fluid control subsystem 231 may receive, generate or modify a wellbore servicing operation plan (for example, a pumping schedule, a wellbore servicing fluid composition, an additive dosing, etc.) that specifies parameters of a wellbore servicing operation to be applied to the wellbore 218.

The method of this disclosure includes adjusting or maintaining a composition of the wellbore servicing fluid 224 being introduced into the wellbore 218 and/or an operational parameter of the wellbore servicing operation based on the determining of the concentration of the one or more components. Such adjusting or maintaining of the wellbore servicing fluid 224 being introduced into the wellbore 218 and/or an operational parameter of the wellbore servicing operation can be manual or automated. For example, the wellbore servicing fluid control subsystem 231 may select or modify (for example, increase or decrease) one or more compositions of the wellbore servicing fluid 224 (e.g., a dosing rate/amount of one or more of the one or more components of the wellbore servicing fluid 224), one or more densities of the wellbore servicing fluid 224, one or more viscosities of the wellbore servicing fluid 224, and one or more other control parameters based on data provided by the MEMS device (s) 40. In one or more embodiments, data provided by the one or more MEMS device(s) 40 may be measured and the measurements and/or results calculated therefrom displayed in real time during the wellbore servicing operation, for example, to an engineer or other operator of the wellbore servicing system 200. An appropriate response can be determined and effected either manually or automatically.

In one or more embodiments, the techniques and operations described herein may be implemented by one or more information handling systems configured to provide the functionality described. In various instances, a computing system may include any of various types of devices, including, but not limited to, personal computer systems, desktop computers, laptops, notebooks, mainframe computer systems, handheld computers, workstations, tablets, application servers, computer clusters, distributed computing systems, storage devices, or any type of computing or electronic device.

In aspects, the determining of the concentration of the one or more components of the WSF 224 can be performed at an uphole location. For example, with reference to FIG. 5, a MEMS device 40 can be positioned along an uphole flow path 219A via which the ("used") WSF 224 flows from annulus 228 back to interior conduit 252. For example, such a flow path can include mud pit inlet pipe 225 fluidly connecting annulus 228 with one or more mud pits 265, one or more mud pits 265, mud pit outlet pipe 227 fluidly connecting the one or more mud pits 265 with one mud pump 222, and feed pipe 226 fluidly connecting pump 222 with interior conduit 252. In FIG. 5, a MEMS device 40A is shown, by way of example, on mud pit inlet line 225, a MEMS device 40B is shown on mud pit outlet line 227, and a MEMS device 40C is shown on feed pipe 226. Other uphole locations present in a drilling or other wellbore servicing operation, which will be apparent to those of skill in the art with the help of this disclosure, are contemplated and within the scope of this disclosure.

The sample 224A of WSF 224 can be being taken from a volume of the wellbore servicing fluid 224 prior to introduction of the volume of the wellbore servicing fluid 224 into the wellbore 218 or subsequent passage of the volume of the wellbore servicing fluid in the wellbore. For example, a MEMS device 40 can be utilized to determine a composition of "fresh" WSF 224 at a production location therefor (e.g., at a liquid mud plant), such that the composition thereof can be utilized to check if the composition of the WSF 224 matches an expected composition of the WSF 224 based on a formulation thereof. In such a manner, a MEMS device 40 can be utilized to confirm correct formulation mixing, potentially much faster than traditional quality assurance testing. A MEMS device 40 of this disclosure can be utilized to determine a composition of a "fresh" wellbore servicing fluid 224 prior to and/or subsequent transport from the production location. For example, the system and method of this disclosure can be utilized, in aspects, to verify a wellbore servicing fluid 224 composition appropriate to prevent settling of components thereof during transport (e.g., via truck, boat, etc.) from the production location to a location of the wellbore 218.

In aspects, determining of the concentration of the one or more components of the WSF 224 can be performed at a downhole location, wherein the sample 224A of WSF 224 is taken from a volume of the wellbore servicing fluid 224 downhole. For example, with reference to FIG. 5, a MEMS device 40 can be positioned along a downhole flow path 219B via which the WSF 224 flows along interior conduit 252, through drill bit 216, and back up annulus 228. For example, as depicted in FIG. 5, a MEMS device 40D can be positioned within a BHA 248, in aspects. In such aspects, the sample 224A of WSF 224 can be taken from a portion of flow path 219B via which the WSF 224 flows within interior conduit 252 and/or a portion of flow path 219B that carries the WSF 224 from nozzles 223 of drill bit 216 to a top of annulus 228.

The determining of the concentration of the one or more components can be performed on samples 224A of the wellbore servicing fluid 224 taken at two or more locations along a flow path (e.g., uphole flow path 219A, downhole flow path 219B) of the wellbore servicing fluid 224. In such aspects, two or more MEMS devices 40 can be positioned along the flow paths of wellbore servicing system 200. The two or more locations can include a first uphole location and a second uphole location. The first uphole location can include a location along a portion of a flow path of the wellbore servicing fluid 224 from the production location therefor or from a fresh WSF 224 holding apparatus upstream of the wellbore 218, and the second uphole location can include a location along uphole flow path 219A of the wellbore servicing fluid 224 downstream of the wellbore 218. For example, a MEMS device 40 can be utilized to determine a concentration of the one or more components of the "fresh" WSF 224 at a mud plant or elsewhere prior to introduction of the "fresh" WSF 224 into interior conduit 252. Another MEMS device 40 (such as MEMS device 40A, MEMS device 40B, or MEMS device 40C) can be utilized to determine a concentration of the one or more components of the WSF 224 after removal thereof from interior conduit 252. In this manner, a loss of the one or more components upon passage through the wellbore 218 can be determined and optionally monitored.

Adjusting or maintaining a composition of the wellbore servicing fluid 224 being introduced into the wellbore 218 can include increasing, decreasing, or maintaining an amount of the one or more components in the wellbore servicing fluid 224 being introduced into the wellbore 218 when the determined concentration of the one or more components is less than, greater than, or substantially equal to, respectively, a desired concentration of the respective one or more components in the wellbore servicing fluid 224 being introduced into the wellbore 218. Any adjustment can be manually effected or automated. In aspects, decreasing a concentration of the one or more components can include increasing an amount of one or more other components of the WSF 224, as will be apparent to those of skill in the art with the help of this disclosure.

A plurality of MPS chips 10/MEMS device(s) 40 can be utilized to provide chemical additive content or concentration data of the WSF (e.g., drilling fluid, completions fluid) 224 in real time. The composition of the WSF (e.g., drilling fluid, completions fluid) may be adjusted to manage the WSF 224 (drilling fluid, completions fluid) chemistry and/or operational parameters of the wellbore servicing (e.g., drilling operation, completions operation) for optimal performance.

The method of this disclosure can be utilized to provide a diagnostic test. In such aspects, the determining of the concentration of the one or more components of the wellbore servicing fluid 224 during the wellbore servicing operation can be utilized to diagnose the presence or absence of an event occurring during the wellbore servicing operation. Without limitation, such an event can include fluid inflow (e.g., a gas kick), an event that increases torque and/or drag on the drill bit 216, fluid outflow (or "loss"), expansion/contraction of the wellbore 218 (also referred to as "wellbore ballooning), or the like. In such aspects, adjusting or maintaining the composition of the wellbore servicing fluid being introduced into the wellbore and/or an operational parameter of the wellbore servicing operation based on the determining of the concentration of the one or more components can be utilized to address the presence or absence of the event.

In aspects, the method can further include determining a composition of a subterranean fluid, such as a formation fluid, via a MEMS device, as described in U.S. patent application Ser. No. 16/879,170 filed May 20, 2020, and entitled, "Methods to Characterize Subterranean Fluid Composition and Adjust Operating Conditions Using MEMS Technology", the disclosure of which is hereby incorporated herein in its entirety for purposes not contrary to this disclosure.

In aspects, a downhole tool can be activated based on the determining of the concentration of the one or more components of the wellbore servicing fluid, as described in U.S. patent application Ser. No. 16/879,172 filed May 20, 2020, and entitled, "Methods to Activate Downhole Tools", the disclosure of which is hereby incorporated herein in its entirety for purposes not contrary to this disclosure.

The method of this disclosure can be utilized to study the chemical and physical interactions between the wellbore servicing fluid 224 and the formation 220, in aspects. In aspects, the method can be utilized in hydraulic management (e.g., by determining the concentration of one or more components including a viscosifier, a thinner, or the like). For example, the method can be utilized to determine a buildup of low gravity solids, a loss of shale inhibitor to cuttings, a shale inhibitor content in wellbore servicing fluid 224, a polymer content in a water based mud (WBM), an emulsifier content, or the like. A few examples are provided in Example 1 and Example 2 hereinbelow.

In aspects, the WSF 224 is a completions fluid. Via aspects of the herein disclosed method, analysis of completion brines can be performed in real time with the MPS chips 10/MEMS device(s) 40. The concentration of additives, for example, such as biocides, lubricants, or corrosion inhibitors can be monitored and an amount thereof in the completions fluid 224 adjusted as needed based on measurements from the MPS chip 10/MEMS device(s) 40. In aspects, for example, this technology can be utilized to determine crystallization temperatures of completions brines.

In aspects, wellbore servicing fluid 224 is a surface treatment fluid. For example, such surface treatment fluids include fluids for changing viscosifiers, cleaning chemicals, solid materials, such as calcium carbonate, and surfactant concentrations, filtration of brines to achieve turbidity specifications, or the like.

Also disclosed herein is a method of dosing one or more components to provide a wellbore servicing fluid 224 having a desired composition for introduction into a wellbore 218. The method includes: determining a concentration of the one or more components of the wellbore servicing fluid 224 in one or more samples 224A of the wellbore servicing fluid 224; and adjusting or maintaining the dosing of the one or more components based on the determining of the concentration of the one or more components in the one or more samples 224A of the wellbore servicing fluid 224, wherein the determining of the concentration of the one or more components includes, for each of the one or more samples 224A, contacting the sample 224A of the wellbore servicing fluid 224 with a microelectromechanical system (MEMS) device 40 to provide a sample response indicative of the concentration of the one or more components.

As described hereinabove, the one or more samples 224A can include an uphole sample 224A of the wellbore servicing fluid 224 taken along a flow path of the wellbore servicing fluid 224 upstream of the wellbore (e.g., above a surface 240 and prior to introduction of the wellbore servicing fluid 224 into the wellbore 218); an uphole sample 224A of the wellbore servicing fluid 224 taken along a flow path of the wellbore servicing fluid 224 downstream of the wellbore (e.g., above surface 240 and after passage of the wellbore servicing fluid 224 out of the annulus 228/wellbore 218); a downhole sample 224A of the wellbore servicing fluid 224 taken along a flow path (e.g., downhole flow path 219B) of the wellbore servicing fluid 224 below a surface 240; or a combination thereof.

Also disclosed herein is a method of servicing a wellbore 218 using MEMS concentration determination method described hereinabove. The method of servicing the wellbore 218 during the wellbore servicing operation includes: fluidly coupling a pump 222 to a source of a wellbore servicing fluid 224 and to the wellbore 218; communicating wellbore servicing fluid 224 into a formation 220 in fluid communication with the wellbore 218 via the pump 222; and determining a concentration of one or more components of the wellbore servicing fluid 224 in one or more samples 224A of the wellbore servicing fluid 224; and adjusting or maintaining the composition of the wellbore servicing fluid 224 being communicated into the formation 220 and/or an operational parameter of the wellbore servicing operation based on the determining of the concentration of the one or more components. As detailed hereinabove, the determining of the concentration of the one or more components includes, for each of the one or more samples 224A, introducing the sample 224A of the wellbore servicing fluid 224 to a microelectromechanical system (MEMS) device 40 operable to provide a sample response indicative of the concentration of the one or more components.

In aspects, adjusting or maintaining the composition of the wellbore servicing fluid 224 being communicated into the formation 220 and/or an operational parameter of the wellbore servicing operation based on the determining of the concentration of the one or more components of the WSF 224 includes adjusting or maintaining a dosing of the one or more components into the wellbore servicing fluid 224 based on the determining of the concentration of the one or more components in the one or more samples 224A of the wellbore servicing fluid 224.

As noted hereinabove, the adjusting or maintaining the composition of the wellbore servicing fluid 224 being communicated into the formation 220 and/or adjusting or maintaining the operational parameter of the wellbore servicing operation based on the determining of the concentration of the one or more components can be at least partially automated. The determining the concentration of one or more components of the wellbore servicing fluid 224 in the one or more samples 224A of the wellbore servicing fluid can be performed substantially in real time.

The method can further include monitoring a trend in the determined concentration of one or more components of the wellbore servicing fluid 224, and utilizing the monitoring of the trend in the adjusting or maintaining of the composition of the wellbore servicing fluid 224 being communicated into the formation 220 and/or in the adjusting or maintaining of the operational parameter of the wellbore servicing operation. Trending of the concentration of the one or more components of the wellbore servicing fluid 224 can be utilized to understand and/or predict future consumption rates, dosing rates, and/or events. When a MEMS device 40 (e.g., MEMS device 40D) is positioned downhole, monitoring of trends can be utilized to manage the wellbore servicing system (e.g., adjust the composition of the WSF 224 being introduced into the wellbore 218) and/or adjust an operational parameter of the wellbore servicing system prior to the WSF 224 returning uphole/to surface 240.

Also disclosed herein is a system (e.g., wellbore servicing system 200) for servicing a wellbore 218. The system includes: at least one microelectromechanical system (MEMS) device 40 operable for determining a concentration of one or more components of a wellbore servicing fluid 224 via a sample response indicative of the concentration of the one or more components, wherein the sample response is obtained via contact of a sample 224A of the wellbore servicing fluid 224 with the MEMS device 40; and a feedback system (e.g., wellbore servicing fluid control system 231, wellbore monitoring system 210, communication link(s) 242) operable to adjust or maintain a composition of the wellbore servicing fluid 224 being introduced into the wellbore 218 and/or an operational parameter of the wellbore servicing operation based on the determined concentration of the one or more components.

As noted hereinabove, the at least one MEMS device 40 can be located uphole or downhole. The system (e.g., wellbore servicing system 200) can include a MEMS device 40 configured for determining of the concentration of the one or more components at an uphole location on a sample 224A of the wellbore servicing fluid 224 taken from a volume of ("fresh") wellbore servicing fluid 224 prior to introduction of the volume of the wellbore servicing fluid 224 into the wellbore 218; a MEMS device 40 (e.g., MEMS device 40A, MEMS device 40B, and/or MEMS device 40C) configured for determining of the concentration of the one or more components of the ("used") WSF 224 at an uphole location on a sample 224A of the wellbore servicing fluid 224 taken from a volume of the wellbore servicing fluid 224 subsequent passage of the volume of the wellbore servicing fluid 224 in the wellbore 218; a MEMS device 40 (e.g., MEMS device 40D) configured for determining of the concentration of the one or more components at a downhole location on a sample 224A of the wellbore servicing fluid 224 taken from a volume of the wellbore servicing fluid 224 downhole; or a combination thereof.

The system can include a first MEMS device 40 at a first uphole location and a second MEMS device 40 located at a second uphole location, wherein the first uphole location includes a location along a flow path of ("fresh") wellbore servicing fluid 224 upstream of the wellbore 218, and wherein the second uphole location includes a location along the flow path of the ("used") wellbore servicing fluid 224 downstream of the wellbore 218.

The system can, in aspects, provide real time determining of the concentration of the one or more components of the wellbore servicing fluid 224. The system can be at least partially automated.

Those of ordinary skill in the art will readily appreciate various benefits that may be realized by the present disclosure. The herein disclosed method provides for determining a concentration of one or more components of a wellbore servicing fluid 224 during a wellbore servicing operation; and adjusting or maintaining a composition of the wellbore servicing fluid 224 being introduced into a wellbore 218 and/or an operational parameter of the wellbore servicing operation based on the determining of the concentration of the one or more components, wherein the determining of the concentration of the one or more components includes contacting a sample 224A of the wellbore servicing fluid 224 with a microelectromechanical system (MEMS) device 40 to provide a sample response indicative of the concentration of the one or more components. The method can enable real time and/or automated dosing of one or more components of a wellbore servicing fluid 224 and/or real time and/or automated adjustment of the operation parameter of the wellbore servicing operation.

EXAMPLES

The embodiments having been generally described, the following examples are given as particular embodiments of the disclosure and to demonstrate the practice and advantages thereof. It is understood that the examples are given by way of illustration and are not intended to limit the specification or the claims in any manner.

EXAMPLES

Example 1

Shale Inhibitor

In aspects, the one or more components of the WSF 224 include a shale inhibitor. In such aspects, adjusting or maintaining the composition of the wellbore servicing fluid 224 can include increasing, decreasing, or maintaining an amount of the (or another) shale inhibitor in the wellbore servicing fluid 224 being introduced into the wellbore 218 when the determined concentration of the shale inhibitor is less than, greater than, or substantially equal to, respectively, a desired concentration of the shale inhibitor in the wellbore servicing fluid 224 being introduced into the wellbore 218.

In some such aspects, the method can further include: measuring torque and/or drag on drill bit 216, equivalent circulating density (ECD), bentonite equivalent (e.g., methylene blue dye test (MBT)), specific gravity of recovered wellbore servicing fluid 224, and/or a pressure while drilling (PWD) in the wellbore 218. The determined concentration of the shale inhibitor can be utilized with the measured torque and/or drag on drill bit 216, equivalent circulating density (ECD), methylene blue dye (MBT), specific gravity of recovered wellbore servicing fluid 224, and/or PWD to trouble shoot a cuttings transport or well-bore stability issue. In such aspects, adjusting or maintaining a composition of the wellbore servicing fluid 224 being introduced into the wellbore 218 and/or an operational parameter of the wellbore servicing operation based on the determining of the concentration of the one or more components can include adjusting or maintaining a composition of the wellbore servicing fluid 224 being introduced into the wellbore and/or adjusting an operational parameter of the wellbore servicing operation to address the cuttings transport or well-bore stability issue. The determined shale inhibitor content can be matched to shale properties from, for example, cuttings analysis or geology. In this manner, wellbore drilling fluid-shale interactions may be studied, for example, by utilizing the sensors 10 to detect the interaction of shale with a small molecule such as shale inhibitor). This data, along with other drilling data and operational parameters can give insight into what specific interactions are occurring down-hole and if adjustments need to be made to the drilling fluid composition and/or operational parameters for improved drilling. For example, if a specific gravity of recovered wellbore servicing fluid 224 (e.g., wellbore servicing fluid 224 removed from annulus 228) and/or MBT is increasing, thus indicating a potential need for additional shale inhibitor in the WSF 224, and the MEMS device 40 determines that the content of shale inhibitor is not below a desired amount, it can be deduced that the problem being experienced is not related to the shale inhibitor content, but some other issue, such as, without limitation, a mud density issue. In similar manner, the method of this disclosure can be utilized diagnostically for a great variety of wellbore servicing issues and associated wellbore servicing fluids 224.

By providing a method of determining the concentration of shale inhibitor, the herein disclosed method can be utilized for clay stabilization (e.g., to adjust a composition of the wellbore servicing fluid 224 to provide appropriate stabilization chemistry thereof).

Example 2

Lubricant

In aspects, the one or more components include a lubricant. In such aspects, adjusting or maintaining the composition of the wellbore servicing fluid 224 and/or adjusting an operational parameter of the wellbore servicing operation can include increasing, decreasing, or maintaining an amount of the lubricant in the wellbore servicing fluid 224 being introduced into the wellbore 218 when the determined concentration of the lubricant is less than, greater than, or substantially equal to, respectively, a desired concentration of the lubricant in the wellbore servicing fluid 224 being introduced into the wellbore 218. In some such aspects, the method can further include measuring the torque and/or drag on the drill bit 216, and utilizing the determined concentration of the lubricant to trouble shoot a source of an increase in the torque and/or the drag, respectively. For example, if the determined lubricant concentration is low and the torque and/or drag are high, an amount of lubricant in the wellbore servicing fluid 224 being introduced into the wellbore 218 can be increased. Alternatively, determining that the lubricant concentration is not low and the torque and/or drag are high can be utilized to diagnose a source of the elevated torque and/or drag (i.e., by confirming that the source of the increased torque and/or drag being encountered is not due to a low lubricant concentration). Should the lubricant content be at a maximum, and the torque and/or drag elevated, adjusting the operational parameter can include, for example, reducing a weight on bit to prevent casing wear and the like. For example, in some cases, torque and drag may be an indication of cuttings build up (e.g., drilling faster than cuttings can be effectively removed from the wellbore). In such instances, the ROP (rate of penetration) may be decreased and/or the density or rheology of the drilling fluid 224 increased to improve the cuttings transport characteristics of the WSF 224.

Additional Disclosure

The following are non-limiting, specific embodiments in accordance with the present disclosure:

In a first embodiment, a method comprises determining a concentration of one or more components of a wellbore servicing fluid during a wellbore servicing operation; and adjusting or maintaining a composition of the wellbore servicing fluid being introduced into a wellbore and/or an operational parameter of the wellbore servicing operation based on the determining of the concentration of the one or more components, wherein the determining of the concentration of the one or more components comprises contacting a sample of the wellbore servicing fluid with a microelectromechanical system (MEMS) device to provide a sample response indicative of the concentration of the one or more components.

A second embodiment can include the method of the first embodiment, wherein the MEMS device comprises a sensor having microcantilever-based self-sensing array (SSA) technology.

A third embodiment can include the method of the second embodiment, wherein the sensor comprises an array of microcantilevers with integrated piezoelectric sensing elements that provide electrical actuation and sensing of resonance frequency.

A fourth embodiment can include the method of the third embodiment, wherein the array of microcantilevers include, for each of the one or more components, one or more microcantilevers comprising a coating sensitive to an analyte specific to the each of the one or more components.

A fifth embodiment can include the method of the fourth embodiment, wherein the coating of at least a portion of the array of microcantilevers comprises a polymer.

A sixth embodiment can include the method of any of the first to fifth embodiments, wherein the sample response is provided via resonance frequency, heat, impedance, or a combination thereof within the MEMS device.

A seventh embodiment can include the method of any of the first to seventh embodiments, wherein the one or more components comprise a chemical additive.

An eighth embodiment can include the method of any one of the first to seventh embodiments, wherein the one or more components comprise a shale inhibitor, a lubricant, an emulsifier, a viscosifier, a thinner, a polymer, a gas, an oil, a hydrocarbon, water, a biocide, a salt, a corrosion inhibitor, a bridging agent, a fluid loss control agent, pH control agent, an antioxidant, an acid generator, or a combination thereof.

A ninth embodiment can include the method of any one of the first to eighth embodiments, wherein the one or more components comprise a lubricant, and wherein the method further comprises: measuring torque and/or drag on a drill bit in the wellbore; and utilizing the determined concentration of the lubricant to trouble shoot a source of an increase in the torque and/or the drag, respectively.

A tenth embodiment can include the method of any one of the first to ninth embodiments, wherein adjusting or maintaining a composition of the wellbore servicing fluid being introduced into the wellbore comprises increasing, decreasing, or maintaining an amount of the one or more components in the wellbore servicing fluid being introduced into the wellbore when the determined concentration of the one or more components is less than, greater than, or substantially equal to, respectively, a desired concentration of the respective one or more components in the wellbore servicing fluid being introduced into the wellbore.

An eleventh embodiment can include the method of the tenth embodiment, wherein the one or more components comprise a shale inhibitor, and wherein adjusting or maintaining a composition of the wellbore servicing fluid comprises increasing, decreasing, or maintaining an amount of the shale inhibitor in the wellbore servicing fluid being introduced into the wellbore when the determined concentration of the shale inhibitor is less than, greater than, or substantially equal to, respectively, a desired concentration of the shale inhibitor in the wellbore servicing fluid being introduced into the wellbore.

A twelfth embodiment can include the method of any one of the first to eleventh embodiments, wherein the determining of the concentration of the one or more components is performed at an uphole location, and wherein the sample is taken from a volume of the wellbore servicing fluid prior to introduction of the volume of the wellbore servicing fluid into the wellbore; wherein the determining of the concentration of the one or more components is performed at an uphole location, and wherein the sample is taken from a volume of the wellbore servicing fluid subsequent passage of the volume of the wellbore servicing fluid in the wellbore; wherein the determining of the concentration of the one or more components is performed at a downhole location, and wherein the sample is taken from a volume of the wellbore servicing fluid downhole; or a combination thereof.

A thirteenth embodiment can include the method of any one of the first to twelfth embodiments, wherein the determining of the concentration of the one or more components is performed on samples of the wellbore servicing fluid taken at two or more locations along a flow path of the wellbore servicing fluid.

A fourteenth embodiment can include the method of the thirteenth embodiment, wherein the two or more locations include a first uphole location and a second uphole location, wherein the first uphole location comprises a location along the flow path of the wellbore servicing fluid upstream of the wellbore, and wherein the second uphole location comprises a location along the flow path of the wellbore servicing fluid downstream of the wellbore.

A fifteenth embodiment can include the method of any one of the first to fourteenth embodiments, wherein the determining of the concentration of the one or more components of the wellbore servicing fluid further comprises: after contacting the sample with the MEMS device to provide the sample response, providing a treated sample by treating the sample to selectively alter a response of the MEMS device; contacting the treated sample with the MEMS device to provide a treated sample response; and utilizing a difference between the treated sample response and the sample response with calibration curves to determine the concentration of the one or more components of the wellbore servicing fluid.

A sixteenth embodiment can include the method of the fifteenth embodiment, wherein treating the sample further comprises treating the sample with a chemical additive that selectively alters the response of the MEMS device, subjecting the sample to ultraviolet light, IR light, visible spectrum light, heat, microwaves, x-rays, laser light, ultrasonic treatment of the sample, or a combination thereof.

A seventeenth embodiment can include the method of the sixteenth embodiment, wherein the chemical additive comprises an acid, a base, an enzyme, an oxidizer, a reducer, and anti-oxidant, an oxygen scavenger, a free radical source, a free radical trap, a chemical reactant, a surfactant, a precipitant, a demulsifier, a flocculant, a deflocculant, or a combination thereof.

An eighteenth embodiment can include the method of any one of the first to seventeenth embodiments, wherein the sample of the wellbore servicing fluid comprises a solids-reduced sample of the wellbore servicing fluid, wherein the solids-reduced sample of the wellbore servicing fluid comprises a reduced amount of solids relative to the wellbore servicing fluid from which the sample is obtained.

A nineteenth embodiment can include the method of the eighteenth embodiment further comprising filtering the wellbore servicing fluid from which the sample is obtained to provide the solids-reduced wellbore servicing fluid.

A twentieth embodiment can include the method of any one of the first to nineteenth embodiments further comprising carrying out the determining at least once every sampling time period, wherein the sampling time period is in a range of from 0.01 to 24 hours.

A twenty first embodiment can include the method of any one of the first to twentieth embodiments, wherein the wellbore servicing fluid comprises a fracturing fluid, a cementitious fluid, a remedial fluid, a perforating fluid, a sealant, a drilling fluid, a drill-in fluid, a spacer fluid, a completion fluid, a gravel pack fluid, a diverter fluid, a gelation fluid, a polymeric fluid, an aqueous fluid, an oleaginous fluid, or a combination thereof.

A twenty second embodiment can include the method of the twenty first embodiment, wherein the wellbore servicing fluid is introduced into the wellbore at a volumetric flow rate of greater than or equal to about 3, 10, 20, 30, or 40 barrels per minute (BPM), or in a range of from about 3 to about 40, from about 3 to about 20, from about 10 to about 20, or from about 5 to about 20 BPM.

A twenty third embodiment can include the method of any one of the first to twenty second embodiments further comprising calculating a parameter of the wellbore servicing fluid based on the determined concentration of the one or more components, and wherein the adjusting or maintaining the composition of the wellbore servicing fluid being introduced into the wellbore and/or the operational parameter of the wellbore servicing operation based on the determining of the concentration of the one or more components comprises adjusting or maintaining the composition of the wellbore servicing fluid to have a desired value of the parameter.

A twenty fourth embodiment can include the method of the twenty third embodiment, wherein the parameter comprises an oil to water ratio (OWR) of the wellbore servicing fluid, a solids concentration of the wellbore servicing fluid, a salinity, a pH value, an additive concentration, a lubricity value, a rheological parameter, a desired filtration control, an excess of lime, an Electrical Stability (ES) value, an alkalinity value, a salinity value, or a combination thereof.

In a twenty fifth embodiment, a method of dosing one or more components to provide a wellbore servicing fluid having a desired composition for introduction into a wellbore comprises: determining a concentration of the one or more components of the wellbore servicing fluid in one or more samples of the wellbore servicing fluid; and adjusting or maintaining the dosing of the one or more components based on the determining of the concentration of the one or more components in the one or more samples of the wellbore servicing fluid, wherein the determining of the concentration of the one or more components comprises, for each of the one or more samples, contacting the sample of the wellbore servicing fluid with a microelectromechanical system (MEMS) device to provide a sample response indicative of the concentration of the one or more components.

A twenty sixth embodiment can include the method of the twenty fifth embodiment, wherein the one or more samples comprise an uphole sample of the wellbore servicing fluid taken along a flow path of the wellbore servicing fluid upstream of the wellbore; an uphole sample of the wellbore servicing fluid taken along a flow path of the wellbore servicing fluid downstream of the wellbore; a downhole sample of the wellbore servicing fluid taken along a flow path of the wellbore servicing fluid below a surface of the wellbore; or a combination thereof.

In a twenty seventh embodiment, a method of servicing a wellbore during a wellbore servicing operation comprises: fluidly coupling a pump to a source of a wellbore servicing fluid and to the wellbore; communicating wellbore servicing fluid into a formation in fluid communication with the wellbore via the pump; determining a concentration of one or more components of the wellbore servicing fluid in one or more samples of the wellbore servicing fluid; and adjusting or maintaining a composition of the wellbore servicing fluid being communicated into the wellbore and/or an operational parameter of the wellbore servicing operation based on the determining of the concentration of the one or more components, wherein the determining of the concentration of the one or more components comprises, for each of the one or more samples, contacting the sample of the wellbore servicing fluid with a microelectromechanical system (MEMS) device to provide a sample response indicative of the concentration of the one or more components.

A twenty eighth embodiment can include the method of the twenty seventh embodiment, wherein adjusting or maintaining the composition of the wellbore servicing fluid being communicated into the wellbore and/or an operational parameter of the wellbore servicing operation based on the determining of the concentration of the one or more components comprises adjusting or maintaining a dosing of the one or more components into the wellbore servicing fluid based on the determining of the concentration of the one or more components in the one or more samples of the wellbore servicing fluid.

A twenty ninth embodiment can include the method of any one of the twenty seventh or twenty eighth embodiments, wherein the adjusting or maintaining the composition of the wellbore servicing fluid being communicated into the wellbore and/or an operational parameter of the wellbore servicing operation based on the determining of the concentration of the one or more components is at least partially automated.

A thirtieth embodiment can include the method of any one of the twenty seventh to twenty ninth embodiments, wherein the determining the concentration of one or more components of the wellbore servicing fluid in the one or more samples of the wellbore servicing fluid is performed substantially in real time.

A thirty first embodiment can include the method of any one of the twenty seventh to thirtieth embodiments further comprising monitoring a trend in the determined concentration of one or more components of the wellbore servicing fluid in the one or more samples of the wellbore servicing fluid, and utilizing the monitoring of the trend in the adjusting or maintaining of the composition of the wellbore servicing fluid being communicated into the wellbore and/or the operational parameter of the wellbore servicing operation.

In a thirty second embodiment, a system for servicing a wellbore comprises: at least one microelectromechanical system (MEMS) device operable for determining a concentration of one or more components of a wellbore servicing fluid via a sample response indicative of the concentration of the one or more components, wherein the sample response is obtained via contact of a sample of the wellbore servicing fluid with the MEMS device during a wellbore servicing operation; and a feedback system operable to adjust or maintain a composition of the wellbore servicing fluid being introduced into the wellbore and/or an operational parameter of the wellbore servicing operation based on the determined concentration of the one or more components.

A thirty third embodiment can include the system of the thirty second embodiment, wherein the at least one MEMS device is located uphole or downhole.

A thirty fourth embodiment can include the system of any one of the thirty second or thirty third embodiments, comprising: a MEMS device configured for determining of the concentration of the one or more components at an uphole location on a sample of the wellbore servicing fluid taken from a volume of the wellbore servicing fluid prior to introduction of the volume of the wellbore servicing fluid into the wellbore; a MEMS device configured for determining of the concentration of the one or more components at an uphole location on a sample of the wellbore servicing fluid taken from a volume of the wellbore servicing fluid subsequent passage of the volume of the wellbore servicing fluid in the wellbore; a MEMS device configured for determining of the concentration of the one or more components at a downhole location on a sample taken from a volume of the wellbore servicing fluid downhole; or a combination thereof.

A thirty fifth embodiment can include the system of any one of the thirty second to thirty fourth embodiments, comprising a first MEMS device at a first uphole location and a second MEMS device located at a second uphole location, wherein the first uphole location comprises a location along a flow path of the wellbore servicing fluid upstream of the wellbore, and wherein the second uphole location comprises a location along the flow path of the wellbore servicing fluid downstream of the wellbore.

A thirty sixth embodiment can include the system of any one of the thirty second to thirty fifth embodiments, wherein the system provides real time determining of the concentration of the one or more components of the wellbore servicing fluid.

A thirty seventh embodiment can include the system of any one of the thirty second to thirty sixth embodiments, wherein the system is at least partially automated.

While embodiments have been shown and described, modifications thereof can be made by one skilled in the art without departing from the spirit and teachings of this disclosure. The embodiments described herein are exemplary only, and are not intended to be limiting. Many variations and modifications of the embodiments disclosed herein are possible and are within the scope of this disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: R=Rl+k*(Ru−Rl), wherein k is a variable ranging from 1 percent to 100 percent with a 1 percent increment, i.e., k is 1 percent, 2 percent, 3 percent, 4 percent, 5 percent, . . . 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim is intended to mean that the subject element is required, or alternatively, is not required. Both alternatives are intended to be within the scope of the claim. Use of broader terms such as includes, includes, having, etc. should be understood to provide support for narrower terms such as consisting of, consisting essentially of, included substantially of, etc.

Accordingly, the scope of protection is not limited by the description set out above but is only limited by the claims which follow, that scope including all equivalents of the subject matter of the claims. Each and every claim is incorporated into the specification as an embodiment of the present disclosure. Thus, the claims are a further description and are an addition to the embodiments of the present disclosure. The discussion of a reference herein is not an admission that it is prior art, especially any reference that may have a publication date after the priority date of this application. The disclosures of all patents, patent applications, and publications cited herein are hereby incorporated by reference, to the extent that they provide exemplary, procedural, or other details supplementary to those set forth herein.

What is claimed is:

1. A method of dosing one or more components to provide a wellbore servicing fluid having a desired composition for introduction into a wellbore, the method comprising:
    determining a concentration of the one or more components of the wellbore servicing fluid in one or more samples of the wellbore servicing fluid; and
    adjusting or maintaining the dosing of the one or more components based on the determining of the concentration of the one or more components in the one or more samples of the wellbore servicing fluid,
    wherein the determining of the concentration of the one or more components comprises, for each of the one or more samples, contacting the sample of the wellbore servicing fluid with a microelectromechanical system (MEMS) device to provide a sample response indicative of the concentration of the one or more components, wherein the MEMS device comprises a sensor having microcantilever-based self-sensing array (SSA) technology, and wherein the sensor comprises an array of microcantilevers with integrated piezoelectric sensing elements that provide electrical actuation and sensing of resonance frequency via a surface stress sensor, a calorimeter, a thermometer calorimeter, an anemometer, a thermistor, a thermobalance, an impedance sensor, and polymer coated thermobalances.

2. The method of claim 1, wherein the one or more samples comprise a sample of the wellbore servicing fluid taken along a flow path of the wellbore servicing fluid upstream of the wellbore and above a surface of the earth; a sample of the wellbore servicing fluid taken along a flow path of the wellbore servicing fluid downstream of the wellbore and above the surface of the earth; a sample of the wellbore servicing fluid taken along a flow path of the wellbore servicing fluid below a surface of the wellbore and below the surface of the earth; or a combination thereof.

3. The method of claim 1, wherein the one or more components comprise a chemical additive.

4. The method of claim 1, wherein the one or more components comprise a shale inhibitor, a lubricant, an emulsifier, a viscosifier, a thinner, a polymer, a gas, an oil, a hydrocarbon, water, a biocide, a salt, a corrosion inhibitor, a bridging agent, a fluid loss control agent, pH control agent, an antioxidant, an acid generator, or a combination thereof.

5. The method of claim 1, wherein the array of microcantilevers includes, for each of the one or more components, one or more microcantilevers comprising a coating sensitive to an analyte specific to the each of the one or more components.

6. The method of claim 1, wherein the one or more samples comprise a sample of the wellbore servicing fluid taken along a flow path of the wellbore servicing fluid upstream of the wellbore and above a surface of the earth; a sample of the wellbore servicing fluid taken along a flow path of the wellbore servicing fluid downstream of the wellbore and above the surface of the earth; a sample of the wellbore servicing fluid taken along a flow path of the wellbore servicing fluid below the surface of the earth; or a combination thereof.

7. A method of servicing a wellbore during a wellbore servicing operation, the method comprising:
    fluidly coupling a pump to a source of a wellbore servicing fluid and to the wellbore;
    communicating wellbore servicing fluid into a formation in fluid communication with the wellbore via the pump; and determining a concentration of one or more components of the wellbore servicing fluid in one or more samples of the wellbore servicing fluid; and adjusting or maintaining a composition of the wellbore servicing fluid being communicated into the wellbore and/or an operational parameter of the wellbore servicing operation based on the determining of the concentration of the one or more components, wherein the determining of the concentration of the one or more components comprises, for each of the one or more samples, contacting the sample of the wellbore servicing fluid with a microelectromechanical system (MEMS) device to provide a sample response indicative of the concentration of the one or more components, wherein the MEMS device comprises a sensor having microcantilever-based self-sensing array (SSA) technology, and wherein the sensor comprises an array of microcantilevers with integrated piezoelectric sensing elements that provide electrical actuation and sensing of resonance frequency via a surface stress sensor, a calorimeter, a thermometer calorimeter, an anemometer, a thermistor, a thermobalance, an impedance sensor, and polymer coated thermobalances.

8. The method of claim 7, wherein adjusting or maintaining the composition of the wellbore servicing fluid being communicated into the wellbore and/or an operational parameter of the wellbore servicing operation based on the determining of the concentration of the one or more components comprises adjusting or maintaining a dosing of the one or more components into the wellbore servicing fluid based on the determining of the concentration of the one or more components in the one or more samples of the wellbore servicing fluid.

9. The method of claim 7, wherein the adjusting or maintaining the composition of the wellbore servicing fluid being communicated into the wellbore and/or an operational parameter of the wellbore servicing operation based on the determining of the concentration of the one or more components is at least partially automated.

10. The method of claim 7, wherein the determining the concentration of one or more components of the wellbore servicing fluid in the one or more samples of the wellbore servicing fluid is performed substantially in real time.

11. The method of claim 7, further comprising monitoring a trend in the determined concentration of one or more components of the wellbore servicing fluid in the one or more samples of the wellbore servicing fluid, and utilizing the monitoring of the trend in the adjusting or maintaining of the composition of the wellbore servicing fluid being communicated into the wellbore and/or the operational parameter of the wellbore servicing operation.

12. The method of claim 7, wherein the array of microcantilevers includes, for each of the one or more components, one or more microcantilevers comprising a coating sensitive to an analyte specific to the each of the one or more components.

13. The method of claim 7, wherein the one or more components comprise a chemical additive, a shale inhibitor, a lubricant, an emulsifier, a viscosifier, a thinner, a polymer, a gas, an oil, a hydrocarbon, water, a biocide, a salt, a corrosion inhibitor, a bridging agent, a fluid loss control agent, pH control agent, an antioxidant, an acid generator, or a combination thereof.

14. A system for servicing a wellbore, the system comprising:

at least one microelectromechanical system (MEMS) device operable for determining a concentration of one or more components of a wellbore servicing fluid via a sample response indicative of the concentration of the one or more components, wherein the sample response is obtained via contact of a sample of the wellbore servicing fluid with the MEMS device during a wellbore servicing operation, wherein the MEMS device comprises a sensor having microcantilever-based self-sensing array (SSA) technology, and wherein the sensor comprises an array of microcantilevers with integrated piezoelectric sensing elements that provide electrical actuation and sensing of resonance frequency via a surface stress sensor, a calorimeter, a thermometer calorimeter, an anemometer, a thermistor, a thermobalance, an impedance sensor, and polymer coated thermobalances; and a feedback system operable to adjust or maintain a composition of the wellbore servicing fluid being introduced into the wellbore and/or an operational parameter of the wellbore servicing operation based on the determined concentration of the one or more components.

15. The system of claim 14, wherein the array of microcantilevers includes, for each of the one or more components, one or more microcantilevers comprising a coating sensitive to an analyte specific to the each of the one or more components.

16. The system of claim 14, wherein the at least one MEMS device is located above a surface of the earth or below the surface of the earth.

17. The system of claim 14, wherein the at least one MEMS device is located uphole above a surface of the earth or below the surface of the earth.

18. The system of claim 17 comprising:
- a MEMS device configured for determining of the concentration of the one or more components at a location above a surface of the earth on a sample of the wellbore servicing fluid taken from a volume of the wellbore servicing fluid prior to introduction of the volume of the wellbore servicing fluid into the wellbore;
- a MEMS device configured for determining of the concentration of the one or more components at a location above a surface of the earth on a sample of the wellbore servicing fluid taken from a volume of the wellbore servicing fluid subsequent passage of the volume of the wellbore servicing fluid in the wellbore;
- a MEMS device configured for determining of the concentration of the one or more components at a location below a surface of the earth on a sample taken from a volume of the wellbore servicing fluid downhole; or
- a combination thereof.

19. The system of claim 17 comprising a first MEMS device at a first location and a second MEMS device located at a second location, wherein the first location comprises a location along a flow path of the wellbore servicing fluid upstream of the wellbore and above a surface of the earth, and wherein the second location comprises a location along the flow path of the wellbore servicing fluid downstream of the wellbore and above the surface of the earth.

20. The system of claim 17, wherein the system provides real time determining of the concentration of the one or more components of the wellbore servicing fluid, wherein the system is at least partially automated, or both.

* * * * *